United States Patent
Kobayashi et al.

[11] Patent Number: 6,143,460
[45] Date of Patent: Nov. 7, 2000

[54] DIAZODISULFONE COMPOUND AND RADIATION-SENSITIVE RESIN COMPOSITION

[75] Inventors: Eiichi Kobayashi; Ken-ichi Yokoyama; Yong Wang; Shin-ichiro Iwanaga, all of Mie, Japan

[73] Assignee: JSR Corporation, Tokyo, Japan

[21] Appl. No.: 09/314,124

[22] Filed: May 19, 1999

[30] Foreign Application Priority Data

May 19, 1998 [JP] Japan .................................. 10-153947

[51] Int. Cl.[7] .................................................. G03F 7/004
[52] U.S. Cl. ...................... 430/170; 430/270.1; 430/905; 534/558; 534/560
[58] Field of Search ................ 430/170, 270.1, 430/905; 534/558, 560

[56] References Cited

U.S. PATENT DOCUMENTS

| | | | |
|---|---|---|---|
| 5,424,166 | 6/1995 | Pawlowski et al. | 430/157 |
| 5,770,343 | 6/1998 | Sato et al. | 430/170 |
| 5,837,419 | 11/1998 | Ushirogouchi et al. | 430/270.1 |
| 5,908,730 | 6/1999 | Nitta et al. | 430/170 |
| 5,945,248 | 8/1999 | Nitta et al. | 430/170 |
| 5,962,180 | 10/1999 | Iwanaga et al. | 430/170 |

FOREIGN PATENT DOCUMENTS

| | | |
|---|---|---|
| 0 440 374 | 8/1991 | European Pat. Off. |
| 102450 | 9/1991 | European Pat. Off. |
| 0 679 951 | 11/1995 | European Pat. Off. |
| 0 704 762 | 4/1996 | European Pat. Off. |
| 58-160259 | 3/1985 | Japan . |
| 2-25850 | 1/1990 | Japan . |

*Primary Examiner*—John S. Chu
*Attorney, Agent, or Firm*—Piper, Marbury, Rudnick & Wolfe, LLP; Steven B. Kelber

[57] ABSTRACT

A novel diazodisulfone compound capable of generating acid having high sensitivity to far ultraviolet rays typified by a KrF excimer laser and the like and capable of providing a resist with superior resolution and patterns when used as a photoacid generator for a chemically amplified resist, and a radiation-sensitive resin composition comprising the diazodisulfone compound. The diazodisulfone compound is represented by the following formulas (1) and (2).

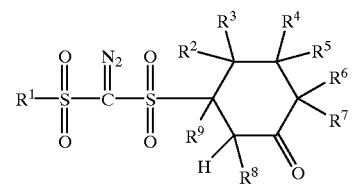

(1)

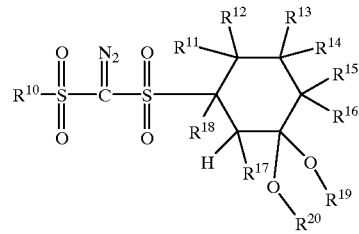

(2)

The radiation-sensitive resin composition comprises the diazodisulfone compound and resin represented by 4-hydroxystyrene/4-(1'-ethoxyethoxy)styrene copolymer.

14 Claims, 4 Drawing Sheets

DIAZODISULFONE COMPOUND AND RADIATION-SENSITIVE RESIN COMPOSITION

BACKGROUND OF THE INVENTION

1. Field of the Invention

The present invention relates to a novel diazodisulfone compound suitable as a photoacid generator for chemically amplified resists which are suitable for use in precision lithography utilizing various types of radiation such as far ultraviolet rays typified by a KrF excimer laser and an ArF excimer laser, and charged particles typified by electron beams, and X-rays. The present invention also relates to a radiation-sensitive resin composition suitable for use as a chemically amplified resist which comprises the novel diazodisulfone compound.

2. Description of the Background Art

In the field of microfabrication exemplified by the manufacture of an integrated circuit device, development of a lithographic process capable of reproducing microfabrication with a line-width precision of 0.5 μm or less has been pursued in recent years to achieve higher integration. To ensure microfabrication in the order of 0.5 μm or less, a resist which can excellently reproduce patterns with a 0.5 μm or less line-width has been required. However, it is difficult to produce such a minute pattern at high precision by conventional methods using visible light (wavelength: 700-400 nm) or near ultraviolet light (wavelength: 400-300 nm). Because of this, the use of radiation with a shorter wavelength (wavelength: less than 300 nm) has been studied.

As examples of such short wavelength radiation, a bright line spectrum of a mercury lamp (wavelength: 254 nm), far ultraviolet rays typified by a KrF excimer laser (wavelength: 248 nm) and an ArF excimer laser (wavelength: 193 nm), charged particles such as electron beams, and X-rays such as synchrotron radiation can be given. Of these, lithography using an excimer laser is regarded as promising due to high output and high efficiency. Lithography using an excimer laser requires a resist which can reproduce fine patterns with a 0.5 μm or less line-width at high sensitivity and high resolution.

Chemically amplified resists comprising a photoacid generator which forms an acid upon irradiation with radioactive rays (hereinafter called "exposure") have been proposed as resists applicable to far ultraviolet ray and a KrF excimer laser. The sensitivity of the chemically amplified resist is increased by the catalytic action of the acid thus formed.

As such a chemically amplified resist, Japanese Patent Application Laid-open No. 45439/1984 discloses a combination of a resin protected with a t-butyl group or a t-butoxycarbonyl group and a photoacid generator. Japanese Patent Application Laid-open No. 52845/1985 discloses a combination of a resin protected by a silyl group and a photoacid generator. In addition to these resist compositions, there are a number of reports dealing with chemically amplified resists, such as a resist which contains a resin protected by an acetal group or a ketal group and a photoacid generator (Japanese Patent Application Laid-open No. 25850/1990).

Of the above chemically amplified resists, the resist comprising an acetal group or a ketal group has attracted attention because this resist produces only a small skirt-like foot which is a problem in basic substrates such as silicon nitride and titanium nitride used for fabrication of devices in recent years (see, for example, Proc. SPIE, Vol.3049, p 314).

However, when a stringent line-width is required such as in the case of fabricating devices with sub-half micron or less, only producing a small skirt-like foot is insufficient. Development of a chemically amplified resist which is almost completely free of a skirt-like foot has been strongly desired.

In view of the above situation of the prior art, an object of the present invention is to provide a novel diazodisulfone compound that is capable of efficiently generating an acid with high sensitivity (with low exposure energy) for various types of radiation, in particular, far ultraviolet rays represented by a KrF excimer laser, ArF excimer laser, and the like, exhibits excellent storage stability, and can provide a resist with superior resolution and patterns when used as a photoacid generator for chemically amplified resists, and a radiation-sensitive resin composition which comprises the diazodisulfone compound as a photoacid generator and can be suitably used as chemically amplified resists.

SUMMARY OF THE INVENTION

According to the present invention, the above object can be achieved by a diazodisulfone compound shown by the following formula (1) (hereinafter called "first invention"),

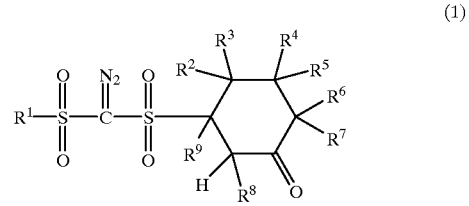

(1)

wherein $R^1$ is a monovalent organic group and $R^2$–$R^9$ independently represent a hydrogen atom, alkyl group having 1–4 carbon atoms, alkoxyl group having 1–4 carbon atoms, or hydroxyalkyl group having 1–4 carbon atoms.

Moreover, according to the present invention, the above object can be achieved by a diazodisulfone compound shown by the following formula (2) (hereinafter called "second invention"),

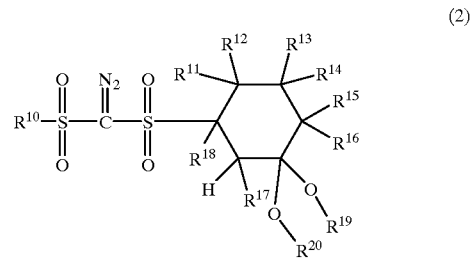

(2)

wherein $R^{10}$ is a monovalent organic group, $R^{11}$–$R^{18}$ independently represent a hydrogen atom, alkyl group having 1–4 carbon atoms, alkoxyl group having 1–4 carbon atoms, or hydroxyalkyl group having 1–4 carbon atoms, and $R^{19}$ and $R^{20}$ independently represent an alkyl group having 1–4 carbon atoms or $R^{19}$ and $R^{20}$ in combination represent a divalent organic group having 2–8 carbon atoms which forms a heterocyclic structure with oxygen.

Furthermore, according to the present invention, the above object can be achieved by a radiation-sensitive resin composition comprising (A) the diazodisulfone compound of the first invention or the diazodisulfone compound of the second invention or both and (B) a resin having a recurring unit shown by the following formula (3) and a recurring unit shown by the following formula (4) (hereinafter called "third invention"),

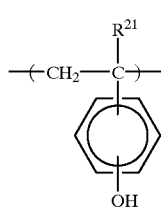

(3)

wherein $R^{21}$ represents a hydrogen atom or a methyl group,

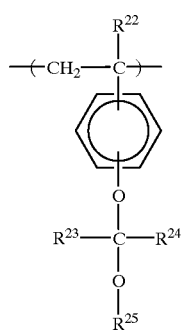

(4)

wherein $R^{22}$ and $R^{23}$ independently represent a hydrogen atom or methyl group, $R^{24}$ represents an alkyl group having 1–4 carbon atoms, and $R^{25}$ represents an alkyl group having 1–6 carbon atoms.

Other objects, features and advantages of the invention will hereinafter become more readily apparent from the following description.

DETAILED DESCRIPTION OF THE INVENTION AND PREFERRED EMBODIMENTS

Figure 1:
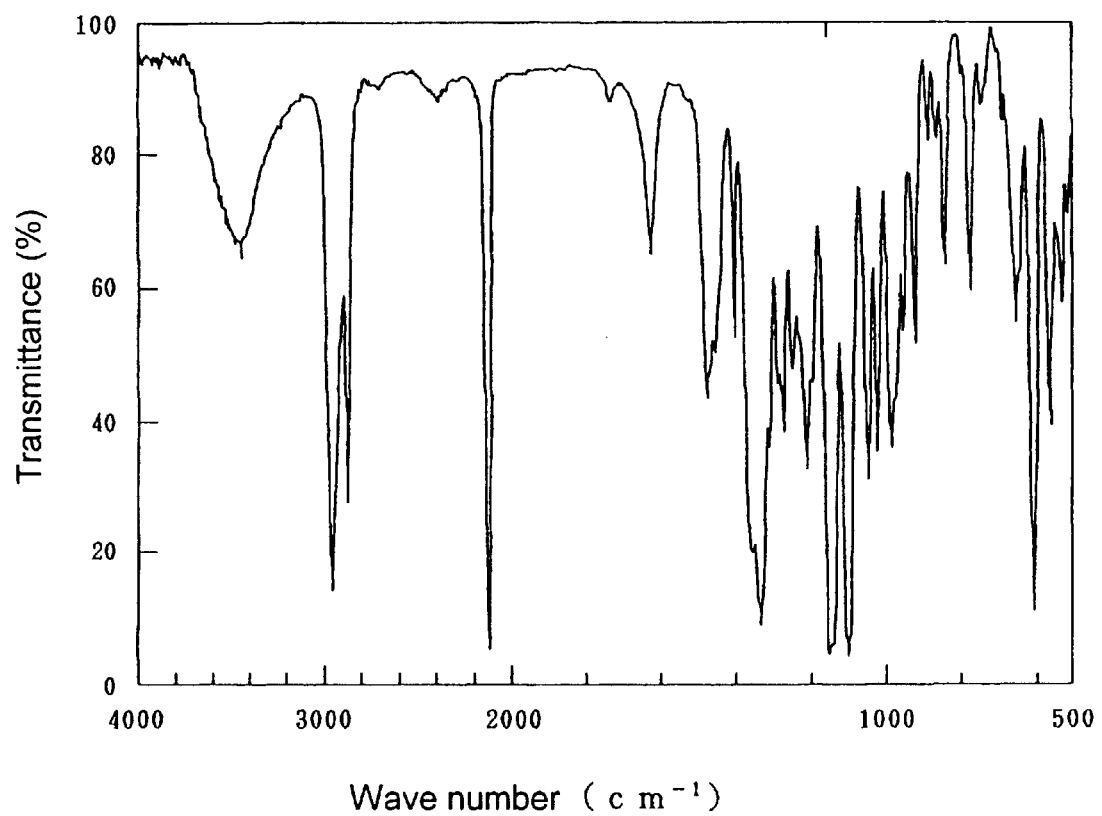
FIG. 1 shows an IR spectrum of the diazodisulfone compound (2) obtained in Synthesis Example 1.

The present invention will be described in detail below.

As a photoacid generator (hereinafter called "acid generator") used for chemically amplified resists, various compounds such as an onium salt compound, sulfonate compound, diazosulfone compound, disulfonylmethane compound, sulfonimide compound, nitrobenzyl compound, and naphthoquinonediazido compound have been conventionally known.

The present inventors have prepared a chemically amplified resist by combining a conventional acid generator with various known resins and have evaluated the characteristics as chemically amplified resists applied on a silicon nitride substrate (SiRN) to discover that use of a diazosulfone compound or a sulfonimide compound as an acid generator and a phenol resin containing an acetal protective group as a resin brought the most preferable result, specifically, a small degree of the skirt-like foot. However, since the skirt-like foot was not completely eliminated, the present inventors have conducted further repeated studies to discover that the skirt-like foot can be basically eliminated by using a diazodisulfone compound containing a specific alicyclic hydrocarbon skeleton comprising a ketone structure or a ketal structure as an acid generator and a specific resin containing an acetal group or a ketal group in combination. This finding has led to the completion of the present invention.

Diazodisulfone Compound (1)

The diazodisulfone compound of the first invention is the compound shown by the above formula (1) (hereinafter called "diazodisulfone compound (1)").

In the formula (1), a carbon atom of the organic group $R^1$ bonds to one sulphur atom of the formula (1).

As preferable examples of $R^1$, a linear, branched, or cyclic alkyl group having 1–12 carbon atoms or its substitution derivatives, a linear, branched, or cyclic alkoxyl group having 1–12 carbon atoms or its substitution derivatives, an aryl group having 6–12 carbon atoms or its substitution derivatives, an aralkyl group having 7–12 carbon atoms or its substitution derivatives, an alicyclic substituent (5) described below, and the like can be given.

As examples of substituents of each substitution derivative in the above preferable examples of $R^1$, a halogen atom, hydroxyl group, nitro group, cyano group, a linear, branched, or cyclic alkoxyl group having 1–10 carbon atoms, an acyl group having 2–10 carbon atoms, a linear, branched, or cyclic alkoxycarbonyloxy group having 2–10 carbon atoms, and the like can be given. Moreover, as examples of substituents of substitution derivatives of an aryl group and substitution derivatives of an aralkyl group, a linear, branched, or cyclic alkyl group having 1–6 carbon atoms, a linear, branched, or cyclic alkoxyl group having 1–6 carbon atoms, and the like can be given.

As particularly preferred specific examples of $R^1$, a t-butyl group, cyclopentyl group, cyclohexyl group, phenyl group, benzyl group, phenethyl group, a group shown by the following formula (5) (hereinafter called "alicyclic substituent (5)"), and the like can be given:

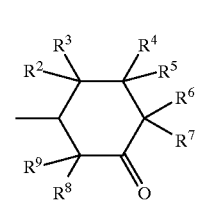

(5)

wherein $R^2$–$R^9$ are the same as $R^2$–$R^9$ defined for the formula (1), respectively.

If two $R^2$s, $R^3$s, $R^4$s, $R^5$s, $R^6$s, $R^7$s, $R^8$s, or $R^9$s are present in the formula (1), the two groups may be either the same or different.

An alkyl group having 1–4 carbon atoms, an alkoxyl group having 1–4 carbon atoms, and a hydroxyalkyl group having 1–4 carbon atoms of $R^2$–$R^9$ can be linear or branched independently.

As particularly preferred examples of $R^2$–$R^9$, a hydrogen atom, methyl group, ethyl group, n-propyl group, i-propyl group, n-butyl group, i-butyl group, t-butyl group, methoxy group, ethoxy group, hydroxymethyl group, 2-hydroxyethyl group, 3-hydroxy-n-propyl group, 2-hydroxy-n-propyl group, 2-hydroxy-i-propyl group, 4-hydroxy-n- butyl group, and the like can be given.

Diazodisulfone Compound (2)

The diazodisulfone compound of the second invention is the compound shown by the above formula (2) (hereinafter called "diazodisulfone compound (2)").

In the formula (2), a carbon atom of the organic group $R^{10}$ bonds to one sulphur atom in the formula (2).

As preferable examples of $R^{10}$, a linear, branched, or cyclic alkyl group having 1–12 carbon atoms or its substitution derivatives, a linear, branched, or cyclic alkoxyl group having 1–12 carbon atoms or its substitution derivatives, an aryl group having 6–12 carbon atoms or its substitution derivatives, an aralkyl group having 7–12 carbon atoms or its substitution derivatives, the alicyclic substituent (5), an alicyclic substituent (6) described below, and the like can be given.

As examples of substituents of each substitution derivative in the above preferable examples of $R^{10}$, a halogen atom, hydroxyl group, nitro group, cyano group, a linear, branched, or cyclic alkoxyl group having 1–10 carbon atoms, an acyl group having 2–10 carbon atoms, a linear, branched, or cyclic alkoxycarbonyloxy group having 2–10 carbon atoms, and the like can be given. Moreover, as examples of substituents of substitution derivatives of an aryl group and substitution derivatives of an aralkyl group, a linear, branched, or cyclic alkyl group having 1–6 carbon atoms, a linear, branched, or cyclic alkoxyl group having 1–6 carbon atoms, and the like can be given.

As particularly preferred specific examples of $R^{10}$, a t-butyl group, cyclopentyl group, cyclohexyl group, phenyl group, benzyl group, phenethyl group, alicyclic substituent (5), alicyclic substituent (6) shown by the following formula (6), and the like can be given:

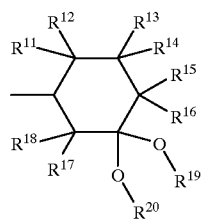

(6)

wherein $R^{11}$–$R^{20}$ are the same as $R^{11}$–$R^{20}$ defined for the formula (2), respectively.

If two $R^{11}$s, $R^{12}$s, $R^{13}$s, $R^{14}$s, $R^{15}$s, $R^{16}$s, $R^{17}$s, $R^{18}$s, $R^{19}$s, or $R^{20}$s are present in the formula (2), the two groups may be either the same or different.

An alkyl group having 1–4 carbon atoms, alkoxyl group having 1–4 carbon atoms, and a hydroxyalkyl group having 1–4 carbon atoms of $R^{11}$–$R^{18}$ can be either linear or branched independently.

As particularly preferred examples of $R^{11}$–$R^{18}$, a hydrogen atom, methyl group, ethyl group, n-propyl group, i-propyl group, n-butyl group, i-butyl group, t-butyl group, methoxy group, ethoxy group, hydroxymethyl group, 2-hydroxyethyl group, 3-hydroxy-n-propyl group, 2-hydroxy-n-propyl group, 2-hydroxy-i-propyl group, 4-hydroxy-n-butyl group, and the like can be given.

An alkyl group having 1–4 carbon atoms of $R^{19}$ and $R^{20}$ can be linear or branched.

As particularly preferred examples of an alkyl group having 1–4 carbon atoms of $R^{19}$ and $R^{20}$, a methyl group, ethyl group, n-propyl group, i-propyl group, n-butyl group, sec-butyl group, t-butyl group, and the like can be given.

As particularly preferred examples of a divalent organic group having 2–8 carbon atoms which forms a heterocyclic structure of $R^{19}$ and $R^{20}$ in combination with a carbon atom and an oxygen atom in the formula (2), groups shown by the following formula (7)–(26), and the like can be given.

(7)

(8)

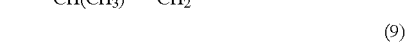
(9)

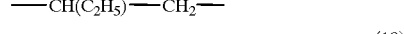
(10)

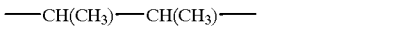
(11)

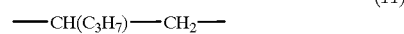
(12)

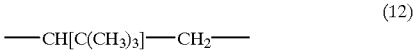
(13)

(14)

(15)

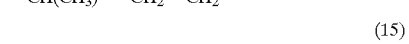
(16)

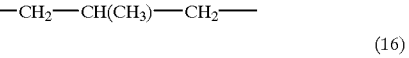
(17)

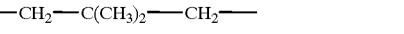
(18)

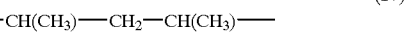
(19)

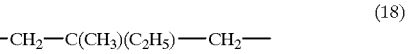
(20)

(21)

(22)

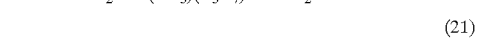
(23)

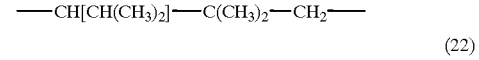
(24)

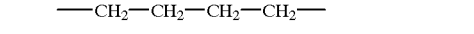
(25)

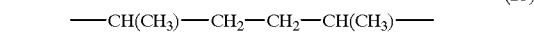
(26)

A general method of synthesizing the diazodisulfone compound (1) and the diazodisulfone compound (2) will be described below.

The diazodisulfone compound (1) can be synthesized by the hydrolysis of a ketal group of the diazodisulfone compound (2) in the presence of an acid (for example, hydrochloric acid). Therefore, a method of synthesizing the diazodisulfone compound (2) will be explained.

The diazodisulfone compound (2) can be synthesized by using a thiol compound containing a group which corresponds to the alicyclic substituent (6) of the compound as a reaction raw material. The thiol compound can be synthesized by using 2-cyclohexen-1-one or its derivatives as a reaction raw material according to, for example, the following scheme (I).

In the scheme (I), a dotted line between two Rs means that there is a case where the two Rs do not bond and the case where the two Rs bond.

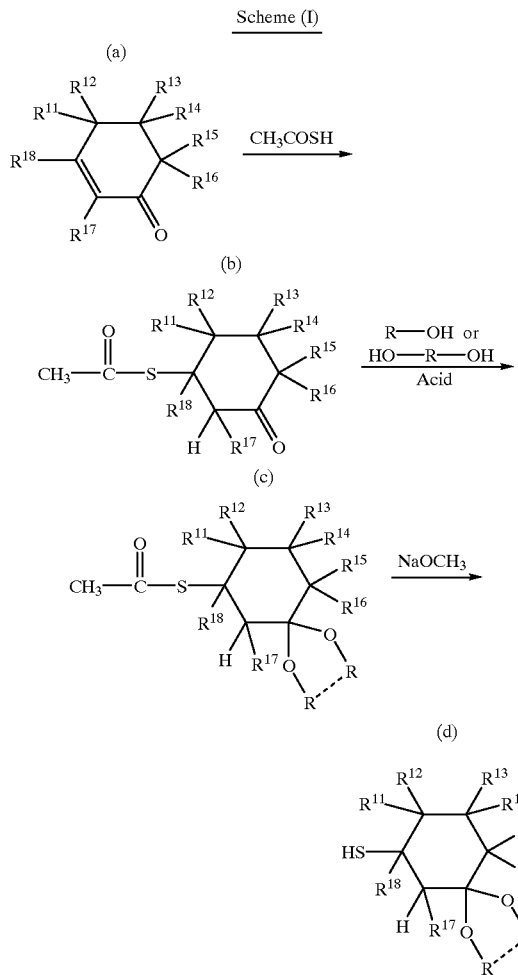

2-cyclohexen-1-one and many of its derivatives ((a) in the scheme (I)) are commercially available as a reagent. As a raw material for synthsizing the diazodisulfone compound (2), 2-cyclohexen-1-one, 2-methyl-2-cyclohexen-1-one, 4,4-dimethyl-2-cyclohexen-1-one, 2,4,4-trimethyl-2-cyclohexen-1-one, 4,4-di-n-propyl-2-cyclohexen-1-one, 2-methoxy-2-cyclohexen-1-one, 5-(2-hydroxy-i-propyl)-2-methyl-2-cyclohexen-1-one, and the like are readily available.

In the reaction of the scheme (I), first, 1 mol of 2-cyclohexen-1-one or its derivative is reacted usually with 1–10 mols, and preferably 1–3 mols of thioacetic acid at usually 0–50° C., and preferably 10–30° C. for usually 2 hours to 100 hours, and preferably 48 hours to 72 hours. The mixture is then distilled and purified to obtain thioacetate which is shown by (a) in the scheme (I). Then, the thioacetate is reacted with a monoalcohol (R—OH) or a diol (HO—R—OH) in the presence of an acid to obtain a ketal compound which is shown by (c) in scheme (I). In this reaction, when a monohydric alcohol is reacted with the thioacetate, a compound in which two Rs are alkyl groups is obtained, and when a diol is reacted with the thioacetate, a compound having a heterocyclic structure in which two Rs are bonded is obtained. Then, the ketal compound is treated in an organic solvent (for example, methanol, ethanol, tetrahydrofuran, and 1,4-dioxane) in the presence of usually 0.01–0.2 mols, and preferably 0.02–0.1 mols of a base (for example, NaOCH$_3$ and KOCH$_3$) for 1 mol of the compound at usually 0–60° C., and preferably 20–50° C. for usually 1–20 hours, and preferably 3–5 hours. The mixture is then purified by column chromatography or distillation to obtain a thiol compound which is shown by (d) of the scheme (I).

The diazodisulfone compound (2) can be synthesized by using the above thiol compound as a reaction raw material according to, for example, the following scheme (II) (the diazodisulfone compound (2) having a symmetrical structure) or scheme (III) (the diazodisulfone compound (2) having an asymmetrical structure). In the schemes (II) and (III), the thiol compound is represented by Z—SH.

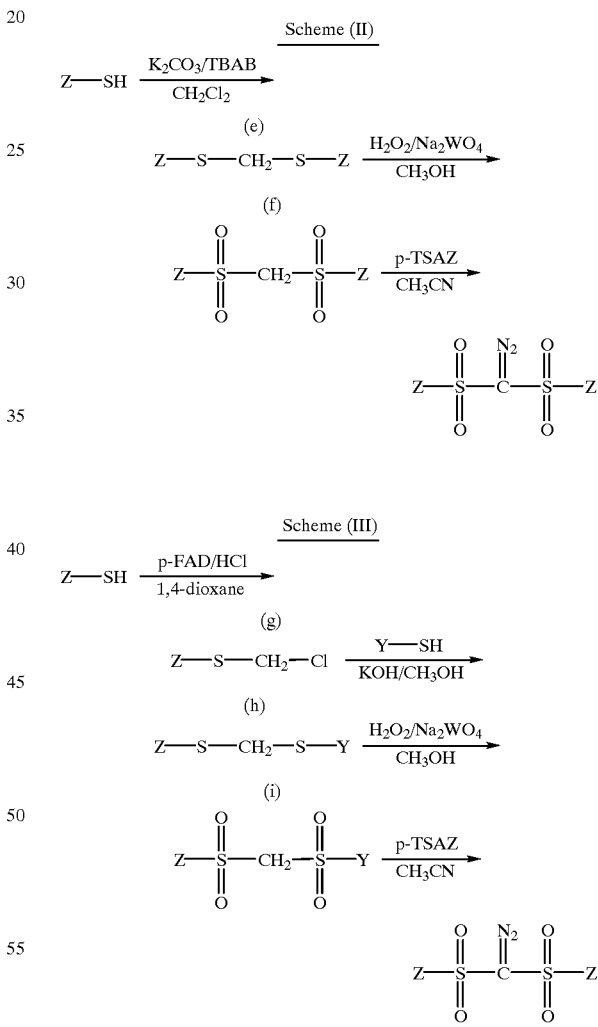

In the reaction of the scheme (II), an appropriate amount of a methylene chloride solution of the thiol compound is added to an aqueous solution of potassium carbonate, and a small amount of a phase transfer catalyst (for example, tetra-n-butyl ammonium bromide (TBAB)) is added. After the mixture has been stirred at 10–40° C., preferably 20–30° C. for usually 2–10 hours, the organic layer is rinsed and dried to obtain a bisthiomethane compound which is shown by (e) in the scheme (II). The bisthiomethane compound is then oxidized using a conventional method to obtain a symmetrical bissulfonylmethane compound which is shown by (f) in the scheme (II). Subsequently, the bissulfonylmethane compound is dissolved in acetonitrile and the like and diazotized by reacting the compound with p-methylbenzenesulfonylazide (p-TSAZ) under basic conditions at room temperature. The mixture is then purified by column chromatography and the solvent is distilled to obtain the diazodisulfone compound (2) having a symmetrical structure.

In the reaction of the scheme (III), the thiol compound is dissolved in a 1,4-dioxane solution of hydrogen chloride. After the addition of paraformaldehyde (p-FAD), the mixture is reacted to obtain a chloride which is shown by (g) in the scheme (III). The resulting chloride is then reacted with thiol (Y—SH) differing from Z—SH under basic conditions to obtain a asymmetrical bissulfonylmethane compound which is shown by (h) of the scheme (III). Subsequently, the bissulfonylmethane compound is oxidized and diazotized in the same manner as in the scheme (II) to obtain the diazodisulfone compound (2) having a dissymmetrical structure.

The diazodisulfone compounds (1) and (2) can generate an acid efficiently with high sensitivity (low exposure energy) for various radioactive rays, in particular, far ultraviolet rays represented by a KrF excimer laser, ArF excimer laser, and the like, and exhibit excellent storage stability. These compounds can provide a resist with superior resolution performance and patterns when used as a photoacid generator for chemically amplified resists and suitably used as an acid generator for chemically amplified resists which are useful for microfabrication.

Radiation-sensitive Resin Composition

The radiation-sensitive resin composition of the third invention comprises (A) the diazodisulfone compound (1) or the diazodisulfone compound (2) or both and (B) a resin having a recurring unit shown by the above formula (3) and a recurring unit shown by the above formula (4).

Each component of the third invention is described below.

Component (A)

The diazodisulfone compound (1) and the diazodisulfone compound (2) which are suitably used as the component (A) of the third invention are described above.

The amount of the diazodisulfone compound (1) or the diazodisulfone compound (2) to be added to the composition of the third invention is usually 0.01–50 parts by weight, preferably 0.1–30 parts by weight, and particularly preferably 0.5–25 parts by weight for 100 parts by weight of the total resin component in the radiation-sensitive resin composition. If the amount of the diazodisulfone compound (1) or the diazodisulfone compound (2) is less than 0.01 part by weight, sensitivity and resolution as a resist tend to be lowered; on the other hand, if the amount exceeds 50 parts by weight, coatability and heat resistance as a resist tend to be lowered.

In the third invention, either one diazodisulfone compound (1) or (2) can be used individually or two or more diazodisulfone compound (1) or (2) can be used in combinations.

In the third invention, acid generators other than the diazodisulfone compound (1) and the diazodisulfone compound (2) (hereinafter called "other acid generators") can be blended in as required.

As examples of other acid generators, ① an onium salt compound, ② a sulfone compound, ③ a sulfonate compound, ④ a sulfonimide compound, and the like can be given. Examples of these other acid generators are given below.

① Onium Salt Compound

As examples of an onium salt compound, iodonium salt, sulfonium salt, phosphonium salt, diazonium salt, ammonium salt, pyridinium salt, and the like can be given.

Specific examples of the onium salt compound include bis(4-t-butylphenyl)iodonium trifluoromethanesulfonate, bis(4-t-butylphenyl)iodonium nonafluorobutanesulfonate, bis(4-t-butylphenyl)iodonium 2-trifluoromethylbenzenesulfonate, bis(4-t-butylphenyl) iodonium 10-camphorsulfonate, bis(4-t-butylphenyl) iodonium p-toluenesulfonate, diphenyliodonium trifluoromethanesulfonate, diphenyliodonium nonafluorobutanesulfonate, diphenyliodonium 2-trifluoromethylbenzenesulfonate, diphenyliodonium 10-camphorsulfonate, diphenyliodonium p-toluenesulfonate, triphenylsulfonium trifluoromethanesulfonate, triphenylsulfonium nonafluorobutanesulfonate, triphenylsulfonium 2-trifluoromethylbenzenesulfonate, triphenylsulfonium 10-camphorsulfonate, triphenylsulfonium p-toluenesulfonate, 4-t-butylphenyldiphenylsulfonium trifluoromethanesulfonate, 4-t-butylphenyldiphenylsulfonium nonafluorobutanesulfonate, 4-t-butylphenyldiphenylsulfonium 2-trifluoromethylbenzenesulfonate, 4-t-butylphenyldiphenylsulfonium 10-camphorsulfonate, 4-t-butylphenyldiphenylsulfonium p-toluenesulfonate, 4-t-butoxyphenyldiphenylsulfonium trifluoromethanesulfonate, 4-t-butoxyphenyldiphenylsulfonium nonafluorobutanesulfonate, 4-t-butoxyphenyldiphenylsulfonium 2-trifluoromethylbenzenesulfonate, 4-t-butoxyphenyldiphenylsulfonium 10-camphorsulfonate, 4-t-butoxyphenyldiphenylsulfonium p-toluenesulfonate, and the like.

② Sulfone Compound

As examples of a sulfone compound, β-ketosulfone, β-sulfonylsulfone, α-diazo compounds of these compounds, and the like can be given.

As specific examples of a sulfone compound, phenacylphenylsulfone, mesitylphenacylsulfone, bis(phenylsulfonyl)methane, 4-trisphenacylsulfone, and the like can be given.

③ Sulfonate Compound

As examples of a sulfonate compound, alkylsulfonate, haloalkylsulfonate, arylsulfonate, iminosulfonate, and the like can be given.

As specific examples of a sulfonate compound, benzointosylate, pyrogalloltristrifluoromethanesulfonate, pyrogallolmethanetrisulfonate, nitrobenzyl-9,10-diethoxyanthracene-2-sulfonate, α-methylolbenzointosylate, α-methylolbenzoinoctanesulfonate, α-methylolbenzointrifluoromethanesulfonate, α-methylolbenzoindodecylsulfonate, and the like can be given.

④ Sulfonimide Compound

As examples of a sulfonimide compound, a compound shown the following formula (27) can be given:

(27)

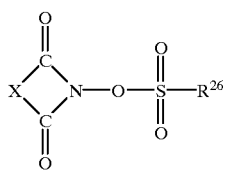

wherein X represents a divalent group such as an alkylene group, arylene group, and alkoxylene group and $R^{26}$ represents a monovalent group such as an alkyl group, aryl group, halogen-substituted alkyl group, and halogen-substituted aryl group.

Specific examples of a sulfonimide compound include: N-(trifluoromethylsulfonyloxy)succinimide, N-(trifluoromethyl sulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2, 3-dicarboximide, N-(trifluoromethylsulfonyloxy)bicyclo[2.2.1]heptane-5,6-oxy-2,3-dicarboximide, N-(trifluoromethylsulfonyloxy) naphthylimide, N-(camphorsulfonyloxy)succinimide, N-(camphorsulfonyloxy)phthalimide, N-(camphorsulfonyloxy)diphenylmaleimide, N-(camphorsulfonyloxy)bicyclo[2.2.1]hept-5-ene-2,3-dicarboximide, N-(camphorsulfonyloxy)-7-oxabicyclo[2.2.1]hept-5-ene-2,3-dicarboximide, N-(camphorsulfonyloxy)bicyclo[2.2.1]heptane-5,6-oxy-2, 3-dicarboximide, N-(camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptane-5,6-oxy-2, 3-dicarboximide, N-(4-methylphenyl sulfonyloxy) naphthylimide, N-(2-trifluoromethylphenylsulfonyloxy) succinimide, N-(2-trifluoromethylphenylsulfonyloxy) phthalimide, N-(2-trifluoromethylphenylsulfonyloxy) diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy) bicyclo[2.2.1]heptane-5,6-oxy-2,3-dicarboximide, N-(2-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptane-5,6-oxy-2, 3-dicarboximide, N-(4-fluorophenylsulfonyloxy) naphthylimide, and the like.

These other acid generators can be used either individually or in combinations of two or more.

The amount of other acid generators to be used is preferably 100 wt % or less, and particularly preferably 50 wt % or less of the amount of the diazodisulfone compound (1) and the diazodisulfone compound (2) in total. Use of other acid generators exceeding 100 wt % tends to cause a skirt-like foot for a resist pattern formed on a basic substrate, whereby the pattern form may deteriorate.

Component (B)

The component (B) of the third invention comprises a resin containing a recurring unit shown by the above formula (3) (hereinafter called "recurring unit (3)"), a recurring unit shown by the above formula (4) (hereinafter called "recurring unit (4) "), and other recurring units as required (hereinafter called "resin (B)").

The recurring unit (4) of the resin (B) contains an acid-decomposable acetal group or ketal group shown by the following formula (28) (hereinafter collectively called "acetal group (28)").

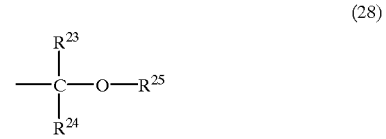

(28)

In the resin (B), each of the recurring unit (3), recurring unit (4), and other recurring units may be contained individually or in combinations of two or more.

The resin (B) may contain a partially crosslinked structure by a suitable crosslinking group (for example, a crosslinking group having a diethylene glycol skeleton).

In the formula (4), an alkyl group having 1–4 carbon atoms for $R^{24}$ may be linear or branched. Examples of $R^{24}$ include a methyl group, ethyl group, n-propyl group, i-propyl group, n-butyl group, i-butyl group, sec-butyl group, t-butyl group, and the like. An alkyl group having 1–4 carbon atoms for $R^{25}$ may be linear, branched, or cyclic. Examples of $R^{25}$ include a methyl group, ethyl group, n-propyl group, i-propyl group, n-butyl group, i-butyl group, sec-butyl group, t-butyl group, n-pentyl group, neopentyl group, n-hexyl group, cyclopentyl group, cyclohexyl group, and the like.

Specific examples of the recurring unit (4) include a unit produced by the cleavage of a polymerizable unsaturated bond of the following compounds: 4-(1'-methoxyethoxy) styrene, 4-(1'-ethoxyethoxy)styrene, 4-(1'-n-propoxyethoxy)styrene, 4-(1'-i-propoxyethoxy)styrene, 4-(1'-n-butoxyethoxy)styrene, 4-(1'-t-butoxyethoxy)styrene, 4-(1'-n-pentyloxyethoxy)styrene, 4-(1'-n-hexyloxyethoxy) styrene, 4-(1'-cyclopentyloxyethoxy)styrene, 4-(1'-cyclohexyloxyethoxy)styrene, 4-(1'-methoxypropoxy) styrene, 4-(1'-ethoxypropoxy)styrene, 4-(1'-n-propoxypropoxy)styrene, 4-(1'-i-propoxypropoxy)styrene, 4-(1'-n-butoxypropoxy)styrene, 4-(1'-t-butoxypropoxy) styrene, 4-(1'-n-pentyloxypropoxy) styrene, 4-(1'-n-hexyloxypropoxy)styrene, 4-(1'-cyclopentyloxypropoxy) styrene, 4-(1'-cyclohexyloxypropoxy)styrene, 4-(1'-methoxybutoxy)styrene, 4-(1'-ethoxybutoxy)styrene, 4-(1'-n-propoxybutoxy)styrene, 4-(1'-i-propoxybutoxy)styrene, 4-(1'-n-butoxybutoxy)styrene, 4-(1'-t-butoxybutoxy) styrene, 4-(1'-n-pentyloxybutoxy)styrene, 4-(1'-n-hexyloxybutoxy)styrene, 4-(1'-cyclopentyloxybutoxy) styrene, 4-(1'-cyclohexyloxybutoxy)styrene, 4-(1'-methoxy-2'-methylpropoxy)styrene, 4-(1'-ethoxy-2'-methylpropoxy) styrene, 4-(1'-n-propoxy-2'-methylpropoxy)styrene, 4-(1'-i-propoxy-2'-methylpropoxy)styrene, 4-(1'-n-butoxy-2'-methylpropoxy)styrene, 4-(1'-t-butoxy-2'-methylpropoxy) styrene, 4-(1'-n-pentyloxy-2'-methylpropoxy)styrene, 4-(1'-n-hexyloxy-2'-methylpropoxy)styrene, 4-(1'- cyclopentyloxy-2'-methylpropoxy)styrene, 4-(1'-cyclohexyloxy-2'-methylpropoxy)styrene, 4-(1'-methoxypentyloxy)styrene, 4-(1'-ethoxypentyloxy)styrene, 4-(1'-n-propoxypentyloxy)styrene, 4-(1'-i-propoxypentyloxy)styrene, 4-(1'-n-butoxypentyloxy)styrene, 4-(1'-t-butoxypentyloxy)styrene, 4-(1'-n-pentyloxypentyloxy)styrene, 4-(1'-n-hexyloxypentyloxy)styrene, 4-(1'-cyclopentyloxypentyloxy)styrene, 4-(1'-cyclohexyloxypentyloxy)styrene, 4-(1'-methoxy-2',2'-dimethylpropoxy)styrene, 4-(1'-ethoxy-2',2'-dimethylpropoxy)styrene, 4-(1'-n-propoxy-2',2'-dimethylpropoxy)styrene, 4-(1'-i-propoxy-2',2'-dimethylpropoxy)styrene, 4-(1'-n-butoxy-2',2'-dimethylpropoxy)styrene, 4-(1'-t-butoxy-2',2'-dimethylpropoxy)styrene, 4-(1'-n-pentyloxy-2',2'-dimethylpropoxy)styrene, 4-(1'-n-hexyloxy-2',2'-dimethylpropoxy)styrene, 4-(1'-cyclopentyloxy-2',2'-dimethylpropoxy)styrene, 4-(1'-cyclohexyloxy-2',2'-dimethylpropoxy)styrene, 4-(1'-methoxyethoxy)-α-methylstyrene, 4-(1'-ethoxyethoxy)-α-methylstyrene, 4-(1'-n-propoxyethoxy)-α-methylstyrene, 4-(1'-i-propoxyethoxy)-α-methylstyrene, 4-(1'-n-butoxyethoxy)-α-methylstyrene, 4-(1'-t-butoxyethoxy)-α-methylstyrene, 4-(1'-n-pentyloxyethoxy)-α-methylstyrene, 4-(1'-n-hexyloxyethoxy)-α-methylstyrene, 4-(1'-cyclopentyloxyethoxy)-α-methylstyrene, 4-(1'-cyclohexyloxyethoxy)-α-methylstyrene, 4-(1'-methoxypropoxy)-α-methylstyrene, 4-(1'-ethoxypropoxy)-α-methylstyrene, 4-(1'-n-propoxypropoxy)-α-methylstyrene, 4-(1'-i-propoxypropoxy)-α-methylstyrene, 4-(1'-n-butoxypropoxy)-α-methylstyrene, 4-(1'-t-butoxypropoxy)-α-methylstyrene, 4-(1'-n-pentyloxypropoxy)-α-methylstyrene, 4-(1'-n-hexyloxypropoxy)-α-methylstyrene, 4-(1'-cyclopentyloxypropoxy)-α-methylstyrene, 4-(1'-cyclohexyloxypropoxy)-α-methylstyrene, 4-(1'-methoxybutoxy)-α-methylstyrene, 4-(1'-ethoxybutoxy)-α-methylstyrene, 4-(1'-n-propoxybutoxy)-α-methylstyrene, 4-(1'-i-propoxybutoxy)-α-methylstyrene, 4-(1'-n-butoxybutoxy)-α-methylstyrene, 4-(1'-t-butoxybutoxy)-α-methylstyrene, 4-(1'-n-pentyloxybutoxy)-α-methylstyrene, 4-(1'-n-hexyloxybutoxy)-α-methylstyrene, 4-(1'-cyclopentyloxybutoxy)-α-methylstyrene, 4-(1'-cyclohexyloxybutoxy)-α-methylstyrene, 4-(1'-methoxy-2'-methylpropoxy)-α-methylstyrene, 4-(1'-ethoxy-2'-methyl propoxy)-α-methylstyrene, 4-(1'-n-propoxy-2'-methylpropoxy)-α-methylstyrene, 4-(1'-i-propoxy-2'-methylpropoxy)-α-methylstyrene, 4-(1'-n-butoxy-2'-methylpropoxy)-α-methylstyrene, 4-(1'-t-butoxy-2'-methylpropoxy)-α-methylstyrene, 4-(1'-n-pentyloxy-2'-methylpropoxy)-α-methylstyrene, 4-(1'-n-hexyloxy-2'-methylpropoxy)-α-methylstyrene, 4-(1'-cyclopentyloxy-2'-methylpropoxy)-α-methylstyrene, 4-(1'-cyclohexyloxy-2'-methylpropoxy)-α-methylstyrene, 4-(1'-methoxypentyloxy)-α-methylstyrene, 4-(1'-ethoxypentyloxy)-α-methylstyrene, 4-(1'-n-propoxypentyloxy)-α-methylstyrene, 4-(1'-i-propoxypentyloxy)-α-methylstyrene, 4-(1'-n-butoxypentyloxy)-α-methylstyrene, 4-(1'-t-butoxypentyloxy)-α-methylstyrene, 4-(1'-n-pentyloxypentyloxy)-α-methylstyrene, 4-(1'-n-hexyloxypentyloxy)-α-methylstyrene, 4-(1'-cyclopentyloxypentyloxy)-α-methylstyrene, 4-(1'-cyclohexyloxypentyloxy)-α-methylstyrene, 4-(1'-methoxy-2',2'-dimethylpropoxy)-α-methylstyrene, 4-(1'-ethoxy-2',2'-dimethylpropoxy)-α-methylstyrene, 4-(1'-n-propoxy-2',2'-dimethylpropoxy)-α-methylstyrene, 4-(1'-i-propoxy-2',2'-dimethylpropoxy)-α-methylstyrene, 4-(1'-n-butoxy-2',2'-dimethylpropoxy)-α-methylstyrene, 4-(1'-t-butoxy-2',2'-dimethylpropoxy)-α-methylstyrene, 4-(1'-n-pentyloxy-2',2'-dimethylpropoxy)-α-methylstyrene, 4-(1'-n-hexyloxy-2',2'-dimethylpropoxy)-α-methylstyrene, 4-(1'-cyclopentyloxy-2',2'-dimethylpropoxy)-α-methylstyrene, 4-(1'-cyclohexyloxy-2',2'-dimethylpropoxy)-α-methylstyrene, 4-(1'-methyl-1'-methoxyethoxy)styrene, 4-(1'-methyl-1'-ethoxyethoxy)styrene, 4-(1'-methyl-1'-n-propoxyethoxy)styrene, 4-(1'-methyl-1'-i-propoxyethoxy)styrene, 4-(1'-methyl-1'-n-butoxyethoxy)styrene, 4-(1'-methyl-1'-t-butoxyethoxy)styrene, 4-(1'-methyl-1'-n-pentyloxyethoxy)styrene, 4-(1'-methyl-1'-n-hexyloxyethoxy)styrene, 4-(1'-methyl-1'-cyclopentyloxyethoxy)styrene, 4-(1'-methyl-1'-cyclohexyloxyethoxy)styrene, 4-(1'-methyl-1'-methoxypropoxy)styrene, 4-(1'-methyl-1'-ethoxypropoxy)styrene, 4-(1'-methyl-1'-n-propoxypropoxy)styrene, 4-(1'-methyl-1'-i-propoxypropoxy)styrene, 4-(1'-methyl-1'-n-butoxypropoxy)styrene, 4-(1'-methyl-1'-t-butoxypropoxy)styrene, 4-(1'-methyl-1'-n-pentyloxypropoxy)styrene, 4-(1'-methyl-1'-n-hexyloxypropoxy)styrene, 4-(1'-methyl-1'-cyclopentyloxypropoxy)styrene, 4-(1'-methyl-1'-cyclohexyloxypropoxy)styrene, 4-(1'-methyl-1'-methoxybutoxy)styrene, 4-(1'-methyl-1'-ethoxybutoxy)styrene, 4-(1'-methyl-1'-n-propoxybutoxy)styrene, 4-(1'-methyl-1'-i-propoxybutoxy)styrene, 4-(1'-methyl-1'-n-butoxybutoxy)styrene, 4-(1'-methyl-1'-t-butoxybutoxy)styrene, 4-(1'-methyl-1'-n-pentyloxybutoxy)styrene, 4-(1'-methyl-1'-n-hexyloxybutoxy)styrene, 4-(1'-methyl-1'-cyclopentyloxybutoxy)styrene, 4-(1'-methyl-1'-cyclohexyloxybutoxy)styrene, 4-(1',2'-dimethyl-1'-methoxypropoxy)styrene, 4-(1',2'-dimethyl-1'-ethoxypropoxy)styrene, 4-(1',2'-dimethyl-1'-n-propoxypropoxy)styrene, 4-(1',2'-dimethyl-1'-i-propoxypropoxy)styrene, 4-(1',2'-dimethyl-1'-n-butoxypropoxy)styrene, 4-(1',2'-dimethyl-1'-t-butoxypropoxy)styrene, 4-(1',2'-dimethyl-1'-n-pentyloxypropoxy)styrene, 4-(1',2'-dimethyl-1'-n-hexyloxypropoxy)styrene, 4-(1',2'-dimethyl-1'-cyclopentyloxypropoxy)styrene, 4-(1',2'-dimethyl-1'-cyclohexyloxypropoxy)styrene, 4-(1'-methyl-1'-methoxypentyloxy)styrene, 4-(1'-methyl-1'-ethoxypentyloxy)styrene, 4-(1'-methyl-1'-n-propoxypentyloxy)styrene, 4-(1'-methyl-1'-i-propoxypentyloxy)styrene, 4-(1'-methyl-1'-n-butoxypentyloxy styrene, 4-(1'-methyl-1'-t-butoxypentyloxy)styrene, 4-(1'-methyl-1'-n-pentyloxypentyloxy)styrene, 4-(1'-methyl-1'-n-hexyloxypentyloxy)styrene, 4-(1'-methyl-1'-cyclopentyloxypentyloxy)styrene, 4-(1'-methyl-1'-cyclohexyloxypentyloxy)styrene, 4-(1',2',2'-trimethyl-1'-methoxypropoxy)styrene, 4-(1',2',2'-trimethyl-1'-ethoxypropoxy)styrene, 4-(1',2',2'-trimethyl-1'-n-propoxypropoxy)styrene, 4-(1',2',2'-trimethyl-1'-i-propoxypropoxy)styrene, 4-(1',2',2'-trimethyl-1'-n-butoxypropoxy)styrene, 4-(1',2',2'-trimethyl-1'-t-butoxypropoxy)styrene, 4-(1',2',2'-trimethyl-1'-n-pentyloxypropoxy)styrene, 4-(1',2',2'-trimethyl-1'-n-hexyloxypropoxy)styrene, 4-(1',2',2'-trimethyl-1'-cyclopentyloxypropoxy)styrene, 4-(1',2',2'-trimethyl-1'-cyclohexyloxypropoxy)styrene, 4-(1'-methyl-1'-methoxyethoxy)-α-methylstyrene, 4-(1'-methyl-1'-ethoxyethoxy)-α-methylstyrene, 4-(1'-methyl-1'-n-propoxyethoxy)-α-methylstyrene, 4-(1'-methyl-1'-i-propoxyethoxy)-α-methylstyrene, 4-(1'-methyl-1'-n-butoxyethoxy)-α-methylstyrene, 4-(1'-methyl-1'-t-butoxyethoxy)-α-methylstyrene, 4-(1'-methyl-1'-n- pentyloxyethoxy)-α-methylstyrene, 4-(1'-methyl-1'-n-hexyloxyethoxy)-α-methylstyrene, 4-(1'-methyl-1'-cyclopentyloxyethoxy)-α-methylstyrene, 4-(1'-methyl-1'-cyclohexyloxyethoxy)-α-methylstyrene, 4-(1'-methyl-1'-methoxypropoxy)-α-methylstyrene, 4-(1'-methyl-1'-ethoxypropoxy)-α-methylstyrene, 4-(1'-methyl-1'-n-propoxypropoxy)-α-methylstyrene, 4-(1'-methyl-1'-i-propoxypropoxy)-α-methylstyrene, 4-(1'-methyl-1'-n-butoxypropoxy)-α-methylstyrene, 4-(1'-methyl-1'-t-butoxypropoxy)-α-methylstyrene, 4-(1'-methyl-1'-n-pentyloxypropoxy)-α-methylstyrene, 4-(1'-methyl-1'-n-hexyloxypropoxy)-α-methylstyrene, 4-(1'-methyl-1'-cyclopentyloxypropoxy)-α-methylstyrene, 4-(1'-methyl-1'-cyclohexyloxypropoxy)-α-methylstyrene, 4-(1'-methyl-1'-methoxybutoxy)-α-methylstyrene, 4-(1'-methyl-1'-ethoxybutoxy)-α-methylstyrene, 4-(1'-methyl-1'-n-propoxybutoxy)-α-methylstyrene, 4-(1'-methyl-1'-i-propoxybutoxy)-α-methylstyrene, 4-(1'-methyl-1'-n-butoxybutoxy)-α-methylstyrene, 4-(1'-methyl-1'-t-butoxybutoxy)-α-methylstyrene, 4-(1'-methyl-1'-n-pentyloxybutoxy)-α-methylstyrene, 4-(1'-methyl-1'-n-hexyloxybutoxy)-α-methylstyrene, 4-(1'-methyl-1'-cyclopentyloxybutoxy)-α-methylstyrene, 4-(1'-methyl-1'-cyclohexyloxybutoxy)-α-methylstyrene, 4-(1',2'-dimethyl-1'-methoxypropoxy)-α-methylstyrene, 4-(1',2'-dimethyl-1'-ethoxypropoxy)-α-methylstyrene, 4-(1',2'-dimethyl-1'-n-propoxypropoxy)-α-methylstyrene, 4-(1',2'-dimethyl-1'-i-propoxypropoxy)-α-methylstyrene, 4-(1',2'-dimethyl-1'-n-butoxypropoxy)-α-methylstyrene, 4-(1',2'-dimethyl-1'-t-butoxypropoxy)-α-methylstyrene, 4-(1',2'-dimethyl-1'-n-pentyloxypropoxy)-α-methylstyrene, 4-(1',2'-dimethyl-1'-n-hexyloxypropoxy)-α-methylstyrene, 4-(1',2'-dimethyl-1'-cyclopentyloxypropoxy)-α-methylstyrene, 4-(1',2'-dimethyl-1'-cyclohexyloxypropoxy)-α-methylstyrene, 4-(1'-methyl-1'-methoxypentyloxy)-α-methylstyrene, 4-(1'-methyl-1'-ethoxypentyloxy)-α-methylstyrene, 4-(1'-methyl-1'-n-propoxypentyloxy)-α-methylstyrene, 4-(1'-methyl-1'-i-propoxypentyloxy)-α-methylstyrene, 4-(1'-methyl-1'-n-butoxypentyloxy)-α-methylstyrene, 4-(1'-methyl-1'-t-butoxypentyloxy)-α-methylstyrene, 4-(1'-methyl-1'-n-pentyloxypentyloxy)-α-methylstyrene, 4-(1'-methyl-1'-n-hexyloxypentyloxy)-α-methylstyrene, 4-(1'-methyl-1'-cycopentyloxypentyloxy)-α-methylstyrene, 4-(1'-methyl-1'-cyclohexyloxypentyloxy)-α-methylstyrene, 4-(1',2',2'-trimethyl-1'-methoxypropoxy)-α-methylstyrene, 4-(1',2',2'-trimethyl-1'-ethoxy propoxy)-α-methylstyrene, 4-(1',2',2'-trimethyl-1'-n-propoxypropoxy)-α-methylstyrene, 4-(1',2',2'-trimethyl-1'-i-propoxy propoxy)-α-methylstyrene, 4-(1',2',2'-trimethyl-1'-n-butoxypropoxy)-α-methylstyrene, 4-(1',2',2'-trimethyl-1'-t-butoxypropoxy)-α-methylstyrene, 4-(1',2',2'-trimethyl-1'-n-pentyloxypropoxy)-α-methylstyrene, 4-(1',2',2'-trimethyl-1'-n-hexyloxypropoxy)-α-methylstyrene, 4-(1',2',2'-trimethyl-1'-cyclopentyloxypropoxy)-α-methylstyrene, 4-(1',2',2'-trimethyl-1'-cyclohexyloxypropoxy)styrene, and the like.

Of these recurring unit (4), a unit produced by the cleavage of a polymerizable unsaturated bond of 4-(1'-methoxyethoxy)styrene, 4-(1'-ethoxyethoxy)styrene, 4-(1'-methyl-1'-methoxyethoxy)styrene, 4-(1'-methoxypropoxy) styrene, 4-(1'-ethoxypropoxy)styrene, 4-(1'-methoxyethoxy)-α-methylstyrene, 4-(1'-ethoxyethoxy)-α-methylstyrene, 4-(1'-methyl-1'-methoxyethoxy)-α-methylstyrene, 4-(1'-methoxy propoxy)-α-methylstyrene, 4-(1'-ethoxypropoxy)-α-methylstyrene, and the like is preferred.

As examples of other recurring units, a unit produced by the cleavage of a polymerizable unsaturated bond of the following compounds can be given: vinyl aromatic compounds such as styrene, α-methylstyrene, 2-methylstyrene, 3-methylstyrene, 4-methylstyrene, 2-methoxystyrene, 3-methoxystyrene, 4-methoxystyrene, 4-t-butoxystyrene, 4-t-butoxycarbonyloxystyrene, 4-t-butoxycarbonylmethyloxystyrene, 4-(2'-t-butoxycarbonylethyloxy)styrene, 4-tetrahydrofuranyloxystyrene, and 4-tetrahydropyranyloxystyrene; (meth) acrylates such as methyl (meth)acrylate, ethyl (meth)acrylate, n-propyl (meth)acrylate, i-propyl (meth)acrylate, n-butyl (meth)acrylate, i-butyl (meth) acrylate, sec-butyl (meth) acrylate, t-butyl (meth)acrylate, n-pentyl (meth)acrylate, neopentyl (meth)acrylate, n-hexyl (meth)acrylate, 2-ethylhexyl (meth) acrylate, 2-hydroxyethyl (meth)acrylate, 2-hydroxypropyl (meth)acrylate, 3-hydroxypropyl (meth)acrylate, cyclopentyl (meth)acrylate, cyclohexyl (meth)acrylate, norbornyl (meth)acrylate, isobornyl (meth)acrylate, tricyclodecanyl (meth)acrylate, dicyclopentenyl (meth)acrylate, adamantyl (meth)acrylate, adamantylmethyl (meth)acrylate, tetrahydrofuranyl (meth)acrylate, tetrahydropyranyl (meth) acrylate, phenyl (meth)acrylate, benzyl (meth)acrylate, and phenethyl (meth)acrylate; unsaturated carboxylic acids such as (meth) acrylic acid, crotonic acid, maleic acid, fumaric acid, and cinnamic acid; carboxyalkyl esters of unsaturated carboxylic acids such as 2-carboxyethyl (meth)acrylate, 2-carboxypropyl (meth)acrylate, and 3-carboxypropyl (meth)acrylate; unsaturated nitryl compounds such as (meth)acrylonitrile, α-chloroacrylonitrile, crotonitrile, maleinitrile, and fumarnitrile; unsaturated amide compounds such as (meth)acrylamide, N,N-dimethyl(meth) acrylamide, crotonamide, maleinamide, and fumaramide; unsaturated imide compounds such as maleimide, N-phenylmaleimide, N-cyclohexylmaleimide; other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole; and the like.

Of these other recurring units, a unit produced by the cleavage of a polymerizable unsaturated bond of styrene, α-methylstyrene, 4-t-butoxystyrene, 4-t-butoxycarbonyloxystyrene, 4-t-butoxycarbonylmethyloxystyrene, 4-(2'-t-butoxycarbonylethyloxy )styrene, t-butyl (meth)acrylate, isobornyl (meth)acrylate, tricyclodecanyl (meth)acrylate, and the like is preferred.

The proportion of the acetal groups (28) introduced into the resin (B) (the proportion of the number of the recurring units (4) to the sum of the number of the recurring unit (3) and the number of the recurring unit (4) in the resin (B)) is preferably 5–90%, and more preferably 10–80%, although the proportion varies depending on the structure of the acetal groups (28) and the resin into which the acetal groups (28) are introduced.

The content of other recurring units in the resin (B) is usually 50 mol % or less, and preferably 30 mol % or less, of the total recurring units.

The polystyrene-reduced weight average molecular weight (hereinafter called "Mw") of the resin (B) determined by a gel permeation chromatography is preferably 1,000–500,000, and more preferably 3,000–300,000.

The resin (B) can be produced by the following processes (a) and (b):
(a) reacting part of phenolic hydroxyl groups in a (co) polymer of 4-hydroxystyrene or 4-hydroxy-α-methylstyrene or both with vinyl ether compounds such as ethyl vinyl ether, ethylene glycol n-butyl vinyl ether, and ethylene glycol cyclohexyl vinyl ether under weak acidic conditions; (b) reacting part of phenolic hydroxyl groups in 4-hydroxystyrene or 4-hydroxy-α-methylstyrene with vinyl ether compounds such as ethyl vinyl ether, ethylene glycol n-butyl vinyl ether, and ethylene glycol cyclohexyl vinyl ether under weak acidic conditions to produce a monomer which corresponds to the recurring unit (4), and then copolymerizing this monomer with a monomer corresponding to the recurring unit (3) by a conventional method.

Moreover, a structure partially crosslinked by a crosslinking group having a diethylene glycol skeleton can be introduced into the resin (B) by, for example, reacting an appropriate amount of diethylene glycol divinyl ether at the same time as reacting vinyl ether compounds in the above process (a).

As examples of the resin (B), a resin having a structure in which part of the hydrogen atoms of phenolic hydroxyl groups in poly (4-hydroxystyrene) is replaced by the acetal groups (28), a resin having a structure in which part of the hydrogen atoms of phenolic hydroxyl groups in the copolymer of 4-hydroxystyrene or 4-hydroxy-α-methylstyrene or both and styrene, other styrene derivatives, or (meth)acrylate is replaced by the acetal group (28) and comprising each recurring unit shown by the following formula (29), and the like are particularly preferable:

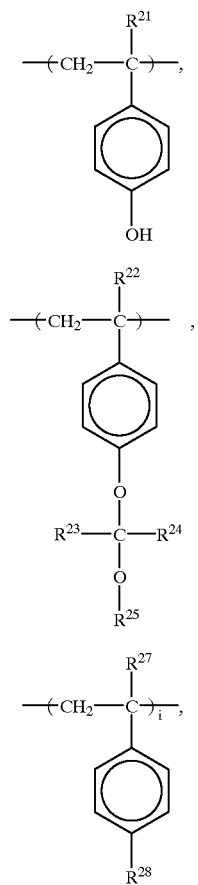

(29)

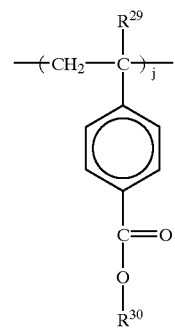

wherein $R^{21}$ is the same as $R^{21}$ defined for the formula (3) $R^{22}$–$R^{24}$ are the same as $R^{22}$–$R^{24}$ defined for the formula (4), respectively, $R^{27}$ and $R^{29}$ independently represent a hydrogen atom or a methyl group, $R^{28}$ represents a hydrogen atom, linear or branched alkyl group having 1–4 carbon atoms, linear or branched alkoxyl group having 1–4 carbon atoms, t-butoxycarbonyloxy group, t-butoxycarbonylmethoxy group, or 2-t-butoxycarbonylethoxy group, $R^{30}$ represents a linear, branched, or cyclic alkyl group having 1–10 carbon atoms, and i and j are 0 or 1, provided that (i+j)≠0.

In the third invention, the resin (B) can be used either individually or in combinations of two or more.

The radiation-sensitive resin composition of the third invention can further comprise resins containing an acid-decomposable group other than the resin (B) (hereinafter called "other resins containing an acid-decomposable group").

Other resins containing an acid-decomposable group will be described below.

Other Resins Containing an Acid-decomposable Group

The other resins containing an acid-decomposable group are resins insoluble or scarcely soluble in an alkaline solution, and these resins are protected by an acid-decomposable group and become alkali-soluble when the acid-decomposable group is decomposed.

The term "insoluble or scarcely soluble in an alkaline solution" used herein means the properties by which, under the conditions of alkaline development employed when forming a resist pattern from the resist film formed by using the radiation-sensitive resin composition comprising the other resins containing an acid-decomposable group, 50% or more of the initial film thickness of the film using only this resin instead of the above resist film remains after development.

As examples of the other resins containing an acid-decomposable group, a resin having a structure in which a hydrogen atom of an acidic functional group in an alkali-soluble resin having one or more acidic functional groups such as a phenolic hydroxyl group and a carboxyl group, for example, an alkali-soluble resin having one or more recurring units shown by the following formulas (30)–(33), is replaced by one or more acid-decomposable groups which can be decomposed in the presence of an acid, and being insoluble or scarcely soluble in an alkaline solution by itself (hereinafter called "resin (C)") can be given:

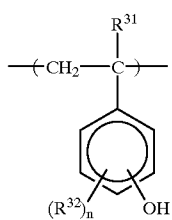

(30)

wherein $R^{31}$ represents a hydrogen atom or a methyl group, $R^{32}$ represents a halogen atom or a monovalent organic group having 1–6 carbon atoms, and n is an integer from 0 to 3;

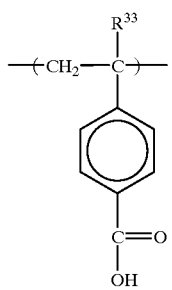

(31)

wherein $R^{33}$ represents a hydrogen atom or a methyl group; and

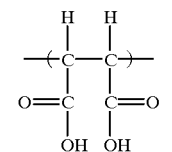

(32)

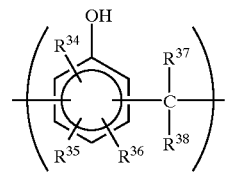

(33)

wherein $R^{34}$–$R^{38}$ independently represent a hydrogen atom or a linear or branched alkyl group having 1–4 carbon atoms.

As examples of an acid-decomposable group in the resin (C), a substituted methyl group, 1-substituted ethyl group, 1-substituted propyl group, 1-branched alkyl group, silyl group, germyl group, alkoxycarbonyl group, acyl group, cyclic acid-decomposable group, and the like can be given.

Examples of the above substituted methyl group include a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, isopropoxycarbonylmethyl group, n-butoxycarbonylmethyl group, t-butoxycarbonylmethyl group, and the like.

Examples of the above 1-substituted ethyl group include a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, 1-t-butoxycarbonylethyl group, and the like.

Examples of the above 1-branched alkyl group include a i-propyl group, sec-butyl group, t-butyl group, 1,1-dimethylpropyl group, 1-methylbutyl group, 1,1-dimethylbutyl group, and the like.

Examples of the above 1-substituted propyl group include a 1-methoxypropyl group, 1-ethoxypropyl group, and the like.

Examples of the above silyl group include a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like.

Examples of the above germyl group include a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like.

Examples of the above alkoxy carbonyl group include a methoxycarbonyl group, ethoxycarbonyl group, i-propoxycarbonyl group, t-butoxycarbonyl group, and the like.

Examples of the above acyl group include an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scuccinyl group, glutaryl group, adipoyl group, piperoyl group, suberoyl group, azelaoyl group, sebacoyl group, acryloyl group, propioyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like.

Examples of the above cyclic acid-decomposable group include a cyclopropyl group, cyclopentyl group, cyclohexyl group, cyclohexenyl group, 4-methoxycyclohexyl groups, tetrahydropyranyl group, tetrahydrofuranyl group, tetrahydrothiopyranyl group, tetrahydrothiofuranyl group, 3-bromotetrahydropyranyl groups, 4-methoxytetrahydropyranyl groups, 4-methoxytetrahydrothiopyranyl groups, 3-tetrahydrothiophene-1,1-dioxide group, and the like.

Of these acid-decomposable groups, a t-butyl group, 1-methoxymethyl group, 1-methoxyethyl group, 1-ethoxyethyl group, 1-ethoxypropyl group, 1-propoxyethyl group, trimethylsilyl group, t-butoxycarbonyl group, t-butoxy arbonylmethyl group, tetrahydropyranyl group, tetrahydrofuranyl group, and the like are preferred.

The proportion of the acid-decomposable group introduced into the resin (C) (the proportion of the number of acid-decomposable groups to the sum of the number of the acidic functional groups and the number of the acid-decomposable groups in the resin (C)) is preferably 10–100%, and more preferably 15–100%, although the proportion varies depending on types of the acid-decomposable groups and the alkali-soluble resins into which the acid-decomposable group is introduced.

The Mw of the resin (C) is preferably 1,000–150,000, and more preferably 3,000–100,000.

The resin (C) can be produced by, for example, a method of introducing one or more acid-decomposable groups into an alkali-soluble resin prepared in advance, a method of (co)polymerizing one or more monomers having an acid-decomposable group, a method of (co)polycondensing one or more polycondensation components having an acid-decomposable group, and the like.

Additives

Various additives such as acid diffusion controllers, surfactants, and photosensitizers can be added to the radiation-sensitive resin composition of the third invention, as required.

Acid diffusion controllers have a function of controlling diffusion of an acid generated from acid generators such as the diazodisulfone compound (1) and diazodisulfone compound (2) in the resist film upon exposure to suppress undesirable chemical reactions in the unexposed area. Use of such acid diffusion controllers ensures improved storage stability of the composition and improved resolution and remarkably excellent process stability as a resist because variation of line width of a resist pattern due to post exposure time delay (PED) from exposure to development can be suppressed.

As acid diffusion controllers, a nitrogen-containing compound of which basicity does not change upon exposure and bake is preferable. Examples of such a compound include compounds shown by $R^{39}R^{40}R^{41}N$ (wherein $R^{39}$–$R^{41}$ independently represent a hydrogen atom, alkyl group, aryl group, or aralkyl group) (hereinafter called "nitrogen-containing compound (i)"), diamino compounds having two nitrogen atoms in one molecule (hereinafter called "nitrogen-containing compound (ii)"), polymers having three or more nitorogen atoms (hereinafter called "nitrogen-containing compound (iii)"), amide group-containing compounds, urea compounds, nitrogen-containing heterocyclic compound, and the like.

Examples of the nitrogen-containing compound (i) include: monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, tri-n-dodecylamine, and n-dodecyldimethylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine.

Examples of the nitrogen-containing compound (ii) include ethylenediamine, N,N,N',N'-tetramethylethylenediamine, 1,4-butanediamine, hexamethylenediamine, 4,4'-diaminodiphenylmethane, 4,4'-diamino diphenyl ether, 4,4'-diaminobenzophenone, 4,4'-diaminodiphenylamine, N,N,N',N'-tetrakis(2-hydroxyethyl) ethylenediamine, N,N,N',N'-tetrakis(2-hydroxypropyl) ethylenediamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like.

Examples of the nitrogen-containing compound (iii) include polyethyleneimine, polyallylamine, polymer of dimethylaminoethylacrylamide, and the like.

Examples of the amide group-containing compound include formamide, N-methylformamide, N,N-dimethylformamide, acetamide, N-methylacetamide, N,N-dimethylacetamide, propioneamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include: imidazoles such as imidazole, benzimidazole, 4-methylimidazole, 2-phenylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, 2,6-dimethanolpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2]octane; and the like.

Of these nitrogen-containing organic compounds, the nitrogen-containing compound (i) and the nitrogen-containing heterocyclic compound are preferable. Trialkylamines are particularly preferred among the nitrogen-containing compound (i), and imidazoles and pyridines are particularly preferred among the nitrogen-containing heterocyclic compounds.

These acid diffusion controllers can be used either individually or in combinations of two or more.

The amount of acid diffusion controllers to be used is usually 5 parts by weight or less, and preferably 10 parts by weight or less for 100 parts by weight of the total resin components in the resin composition, although the amount varies depending on types of acid diffusion controllers, diazodisulfone compound (1), diazodisulfone compound (2), and other acid generators, and the like. If the amount of acid diffusion controllers exceeds 10 parts by weight, sensitivity as a resist and developability of exposed areas tend to be lowered.

The above-mentioned surfactants improve coatability, striation, developability, and the like of the radiation-sensitive resin composition.

As surfactants, any one of anionic, cationic, nonionic, and ampholytic surfactants can be used. Of these, nonionic surfactants are preferred.

As examples of nonionic surfactants, polyoxyethylene higher alkyl ethers, polyoxyethylene higher alkyl phenyl ethers, higher fatty acid diesters of polyethylene glycol, and the like, and commercially available products such as KP series (manufactured by Shin-Etsu Chemical Co., Ltd.), Polyflow series (manufactured by Kyoeisha Yushi Co., Ltd.), F-top series (manufactured by Tohkem Products Corporation), Megafac series (manufactured by Dainippon Ink And Chemicals, Inc.), Fluorard series (manufactured by Sumitomo 3M Ltd.), Asahi Guard series, Surflon series (manufactured by Asahi Glass) can be given.

These surfactants can be used either individually or in combinations of two or more.

The amount of surfactants to be used is usually 2 parts by weight or less as the active component of surfactants for 100 parts by weight of the total resin components in the resin composition.

The above-mentioned sensitizers absorb energy from radioactive rays and transmit this energy to a radiation-sensitive acid forming agent to increase the amount of acid to be generated, thereby improving the apparent sensitivity of the radiation-sensitive resin composition.

As examples of preferable photosensitizers, acetophenones, benzophenones, naphthalenes, biacetyl, eosine, rose bengal, pyrenes, anthracenes, phenothiazines, and the like can be given.

These photosensitizers can be used either individually or in combinations of two or more.

The amount of photosensitizers to be used is usually 50 parts by weight or less, and preferably 30 parts by weight or less for 100 parts by weight of the total resin components in the resin composition.

Moreover, use of dyes or pigments moderates the effect of halation at the time of exposure by making a latent image of the exposed part visible, and use of adhesion adjuvants improves adhesion to substrates.

As examples of other additives, halation inhibitors, preservatives, antifoaming agents, form improving agents, specifically, 4-hydroxy-4'-methylchalcone and the like can be given.

Composition Solution

When the radiation-sensitive resin composition of the third invention is used, the composition is prepared as a solution by dissolving the composition in a solvent so that the solid component concentration is, for example, 1–50 wt %, and filtering the solution using a filter having a pore size of, for example, 0.2 $\mu$m.

As examples of the above solvents, ethers, esters, ether esters, ketones, ketone esters, amides, amide esters, lactams, lactones, (halogenated) hydrocarbons, more specifically, ethylene glycol monoalkyl ethers, diethylene glycol dialkyl ethers, propylene glycol monoalkyl ethers, propylene glycol dialkyl et hers, ethylene glycol monoalkyl ether acetates, propylene glycol monoalkyl ether acetates, acetic acid esters, hydroxyacetic acid esters, lactic acid esters, alkoxy-acetic acid esters, acetoacetic acid esters, pyruvic acid esters, proprionic acid esters, butyric acid esters, 2-hydroxy-2-methylproprionic acid esters, 3-alkoxyproprionic acid esters, 2-hydroxy-3-methylbutyric acid esters, chain or cyclic ketones, N,N-dialkylformamides, N,N-dialkylacetamides, N-alkylpyrrolidones, γ-lactones, (halogenated) aliphatic hydrocarbons, (halogenated) aromatic hydrocarbons, and the like can be given.

Specific examples of such solvents include ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, isopropenyl propionate, ethyl acetate, n-propyl acetate, i-propenyl acetate, n-butyl acetate, 3-methoxybutyl acetate, 3-methyl-3-methoxybutyl acetate, ethyl hydroxyacetate, ethyl lactate, ethoxyethyl acetate, methyl acetoacetate, ethyl acetoacetate, 3-methyl-3-methoxybutyl propionate, 3-methyl-3-methoxybutyl butyrate, 2-hydroxy-2-methylethyl propionate, 3-methoxymethyl propionate, 3-methoxyethyl propionate, 3-ethoxymethyl propionate, 3-ethoxyethyl propionate, 2-hydroxy-3-methylmethy buthylatel, methyl ethyl ketone, cyclohexanone, 2-heptanone, 3-heptanone, 4-heptanone, N,N-dimethylformamide, N,N-dimethylacetamide, N-methylpyrrolidone, toluene, xylene, and the like.

Of these solvents, propylene glycol monoalkyl ether acetates, lactic acid esters, 3-alkoxyproprionic acid esters, and the like are preferred.

The above solvents can be used either individually or in combinations of two or more.

Furthermore, one or more high boiling-point solvents such as benzyl ethyl ether, di-n-hexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and ethylene glycol monophenyl ether acetate can be added to the above solvents as required.

Formation of Resist Pattern

The radiation-sensitive resin composition of the third invention comprises a resin component containing the acid-decomposable acetal groups (28) that decompose by the action of an acid generated from acid generators such as the diazodisulfone compound (1), diazodisulfone compound (2), and the like upon exposure to form a phenolic hydroxyl group, whereby the resin component becomes alkali-soluble to form a positive-tone resist pattern.

When the resist pattern is formed from the radiation-sensitive resin composition of the third invention, the composition solution prepared as described above is applied to, for example, substrates such as a silicon wafer and a wafer coated with aluminum by rotational coating, cast coating, roll coating, and the like to form a resist film. After the resist film is treated by a pre-bake (hereinafter called "PB"), the film is exposed through a specific mask pattern. As examples of radiation which can be used here, far ultraviolet rays such as a bright line spectrum of a mercury lamp (wavelength: 254 nm), KrF excimer laser (wavelength: 248 nm), and ArF excimer laser (wavelength: 193 nm) are preferable. Moreover, according to the types of other acid generators, X-rays such as synchrotron radiation, charged particle rays such as electron beams, and ultraviolet rays such as i-rays (wavelength: 365 nm) can be used. The exposure conditions such as the amount of rays are determined appropriately according to the composition of the resin composition, types of additives, and the like.

After exposure, a post exposure bake (hereinafter called "PEB") is preferably performed in order to improve the apparent sensitivity of the resist.

The heating temperature is usually 30–200° C., and preferably 50–150° C., although the heating conditions vary according to the composition of the resin composition, types of additives, and the like.

The resist film is then developed using an alkaline developer to form a specific resist pattern.

As the above alkaline developer, an alkaline aqueous solution containing one or more alkaline compounds such as alkaline metal hydroxides, aqueous ammonia, alkylamines, alkanolamines, heterocyclic amines, tetraalkylammonium hydroxides, corrin, 1,8-diazabicyclo[5.4.0]-7-undecene, and 1,5-diazabicyclo[4.3.0]-5-nonene at a concentration of usually 5–10 wt %, and preferably 2–5 wt % is used. Of these, an aqueous solution of tetraalkylammonium hydroxides is particularly preferred.

Moreover, an appropriate amount of water-soluble organic solvents such as methanol and ethanol, surfactants, and the like can be added to a developer consisting of the above alkaline aqueous solution.

When a developer consisting of the above alkaline aqueous solution is used, the resist film is generally washed after development.

EXAMPLES

The present invention will now be described in more detail by way of Examples, which should not be construed as limiting the present invention.

Synthesis Example 1

To a flask (300 ml) charged with 50 g (0.52 mol) of 2-cyclohexene-1-one, 40 g (0.52 mol) of thioacetic acid was added dropwise carefully under stirring while cooling the flask with water to keep the internal temperature from raising. The mixture was standed for 48 hours. The reaction product was evaporated under reduced pressure at 82–88° C. and 0.3–0.5 mmHg to obtain 74 g of thioacetate.

17.2 g (0.1 mol) of the thioacetate was dissolved in 80 ml of methylene chloride. 1.9 g (0.01 mol) of p-toluenesulfonic acid and 17 g (about 0.2 mol) of 2,2-dimethylpropanediol-1,3 were then added to the solution. After the mixture was stirred for 12 hours at room temperature, 1.5 ml of triethylamine was added and methylene chloride was evaporated under reduced pressure. 200 g of a 10 wt % brine was then added and the mixture was stirred. After the reaction product was extracted with n-hexane, magnesium sulfate anhydride was added to dry the extract. After filtration, n-hexane was evaporated under reduced pressure. The residue was dried for 24 hours at room temperature under reduced pressure to obtain 14 g of a ketal compound. 10 g of the ketal compound was dissolved in 90 ml of methanol. Then, 2 ml of 28 wt % methanol solution of sodium methoxide was added to the solution and the mixture was stirred for 3 hours at room temperature to hydrolyze the thioester part. After the addition of 30 ml of purified water, the methanol was evaporated under reduced pressure. 3N-hydrochloric acid was added to the residue to adjust the pH to 1–3. The reaction product was extracted with methylene chloride, followed by the addition of magnesium sulfate anhydride to dry the extract. After removal of magnesium sulfate by filtration, n-hexane was evaporated under reduced pressure to obtain 8 g of a thiol compound shown by the following formula (34).

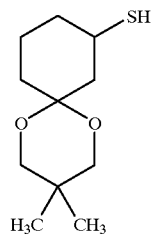

(34)

6 g of the thiol compound was dissolved in 30 ml of methylene chloride. To the solution were added 320 mg of tetra-n-butylammonium bromide, 3.0 g of sodium hydroxide, and 30 ml of water. After stirring the mixture for 1 hour at room temperature, the organic layer was removed and washed with 100 ml of a 10 wt % ammonium chloride aqueous solution. Methylene chloride was evaporated under reduced pressure to obtain 10 g of a bisthiomethane compound. 9 g of this bisthiomethane compound and 6 g of ammonium acetate were added to 60 ml of ethanol. To the mixture, 180 mg of sodium tungstate 1-hydrate and 6 g of a 31 wt % hydrogen peroxide solution were added, followed by stirring at 80° C. for 2 hours. 10 ml of dioxane and 6 g of a 31 wt % hydrogen peroxide solution were then added and the mixture was stirred at 80° C. for another 6 hours. After the addition of 150 ml of purified water, the mixture was cooled and filtered to obtain 8.2 g of a bissulfonylmethane compound.

3.0 g of this bissulfonylmethane compound was dissolved in 80 ml of acetonitrile and 20 ml of triethylamine and 6.0 g of p-toluenesulfoneazide were added. The mixture was stirred for 4 hours at room temperature and the acetonitrile was evaporated under reduced pressure. 4 ml of methanol was then added and the mixture was allowed to stand for 1 week in a refrigerator at 5° C. to obtain 2 g of the diazodisulfone compound (2) shown by the following formula (35) as a white solid.

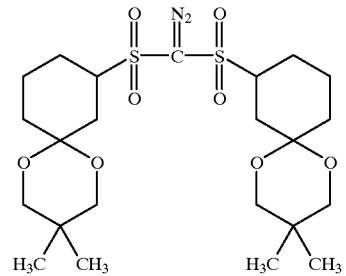

(35)

The IR spectrum of this diazodisulfone compound (2) is shown in FIG. 1. The chemical shift (ppm) of this diazodisulfone compound (2) determined by a $^1$H-NMR spectroscopy (90 MHz, dimethylsulfoxide hexadeuteride) was 3.54 (s, 4H, Hb), 3.45 (s, 4H, Hc), 3.40 (m, 2H, Ha), 2.60-1.10 (m, 16H, other hydrogen atom of cyclohexyl part), 0.95 (s, 6H, Hd), 0.90 (s, 6H, He) and the FAB (fast atom bombardment) mass spectrometry value (m+H+) was 535. The positions of each hydrogen atom Ha—He determined by the above $^1$H-NMR spectroscopy are shown by the following formula.

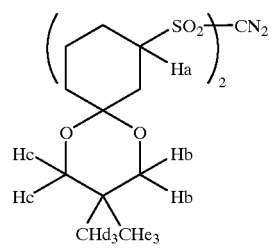

Synthesis Example 2

17.2 g (0.1 mol) of the thioacetate was dissolved in 80 ml of methylene chloride and 1.9 g (0.01 mol) of p-toluenesulfonic acid and 10 g (about 0.2 mol) of ethylene glycol was added to the solution. After stirring the mixture for 12 hours at room temperature, 1.5 ml of triethylamine was added and the methylene chloride was evaporated under reduced pressure. 200 g of a 10 wt % brine was then added and the mixture was stirred. The reaction product was extracted with n-hexane and magnesium sulfate anhydride was added to dry the extract. After filtration, n-hexane was evaporated under reduced pressure. The residue was dried for 24 hours at room temperature under reduced pressure to obtain 14 g of a ketal compound. 10 g of this ketal compound was dissolved in 90 ml of methanol. To the solution, 2 ml of 28 wt % methanol solution of sodium methoxide was added, and the mixture was stirred for 3 hours at room temperature to hydrolyze the thioester part. After the addition of 60 ml of purified water, the methanol was evaporated under reduced pressure and 3N-hydrochloric acid was added to adjust the pH to 1–3. The reaction product was extracted with methylene chloride and magnesium sulfate anhydride was added to dry the extract. After separation of magnesium sulfate, n-hexane was evaporated under reduced pressure to obtain 6.6 g of a thiol compound shown by the following formula (36).

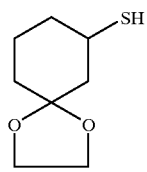

(36)

This thiol compound was reacted with methylene chloride to obtain 5 g of a bisthiomethane compound in the same manner as in Synthesis Example 1. The resulting compound was oxidized and diazotized to obtain 2.2 g of the diazodisulfone compound (2) shown by the following formula (37) as a white solid.

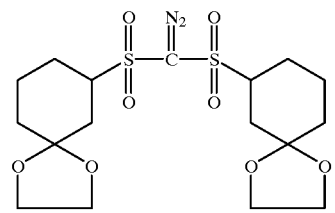

(37)

Figure 2:
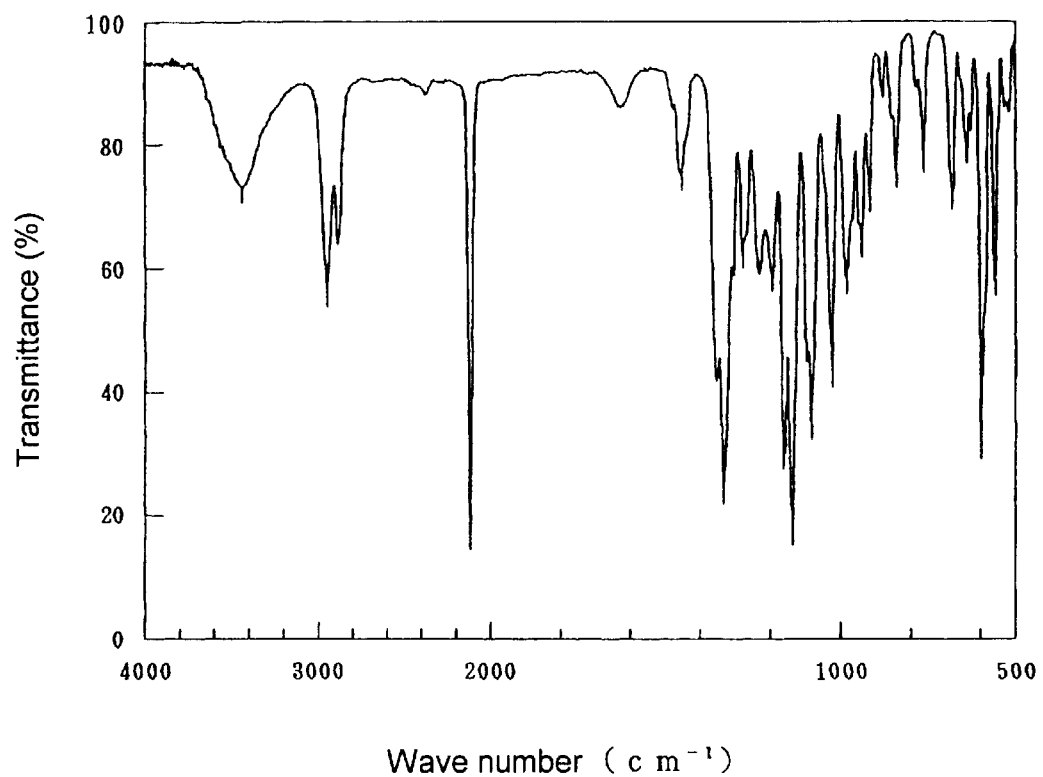
FIG. 2 shows an IR spectrum of the diazodisulfone compound (2) obtained in Synthesis Example 2.

The IR spectrum of this diazodisulfone compound (2) is shown in FIG. 2. The chemical shift (ppm) of this diazodisulfone compound (2) determined by a $^1$H-NMR spectroscopy (90 MHz, dimethylsulfoxide hexadeuteride) was 3.90 (s, 8H, Hb and Hc), 3.56 (m, 2H, Ha), 2.30-1.30 (m, 16H, other hydrogen atom of cyclohexyl part) and the FAB (fast atom bombardment) mass spectrometry value (m+H−) was 451. The positions of each hydrogen atom Ha-Hc determined by the above $^1$H-NMR spectroscopy are shown by the following formula.

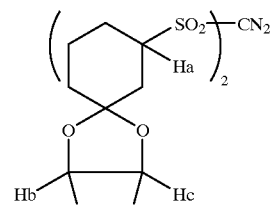

Synthesis Example 3

10 g of the thiol compound obtained in Synthesis Example 1 and 2.3 g of pottasium hydroxide were dissolved in 30 ml of ethanol. 4.5 g of chloromethyl cyclohexyl sulfide and 30 ml of methanol were added dropwise to the solution while stirring to obtain 8.1 g of a bisthiomethane compound shown by the following formula (38).

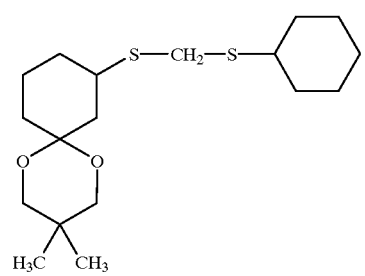

(38)

This bisthiomethane compound (38) was oxidized by hydrogen peroxide in the same way as described in Synthesis Example 1 into 6.8 g of the bissulfonylmethane compound as a white solid.

Figure 3:
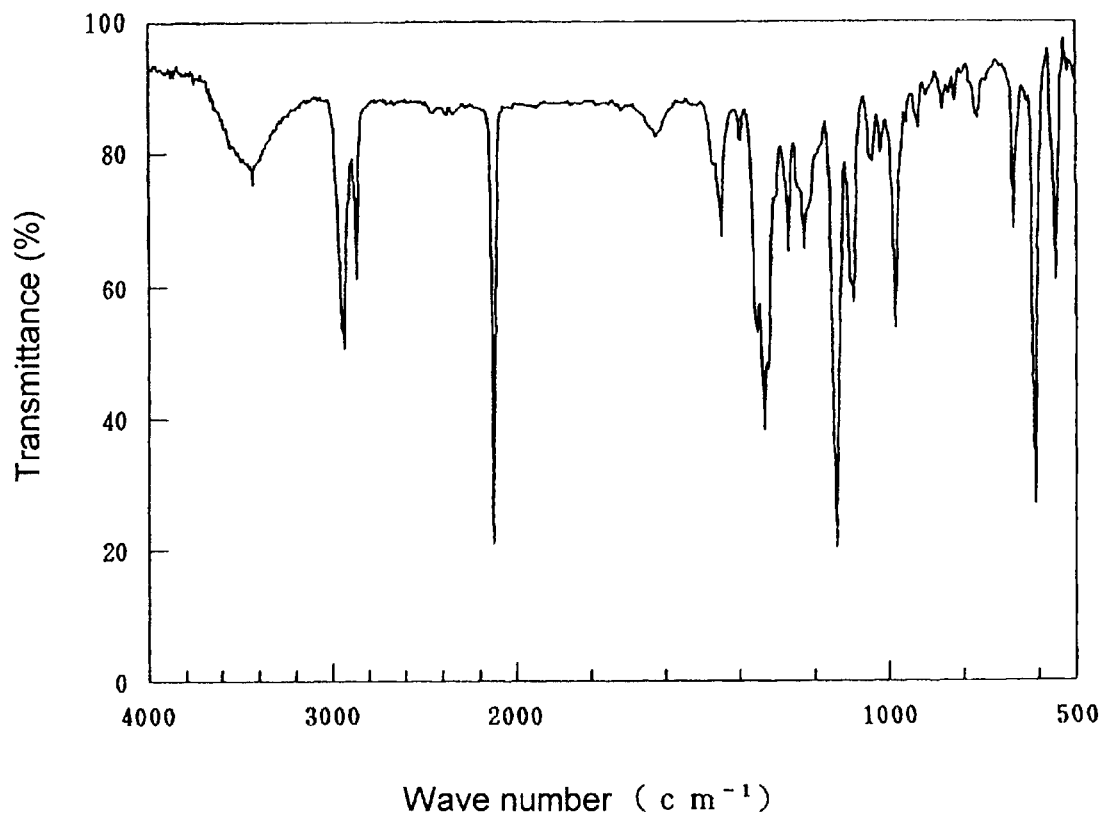
FIG. 3 shows an IR spectrum of the diazodisulfone compound (2) obtained in Synthesis Example 3.

2.5 g of this bissulfonylmethane compound was added to a solution of 2.5 g of p-carboxybenzenesulfoneazide and 5 ml of triethylamine dissolved in 30 ml of acetonitrile and the mixture was stirred for 4 hours at room temperature. After the addition of 250 ml of water, the organic solvent was evaporated under reduced pressure. The organic layer was extracted with 50 ml methylene chloride, and washed with 100 ml of a 10 wt % sodium carbonate aqueous solution and condensed to 10 ml under reduced pressure at room temperature, and was purified by column chromatography to give 1.2 g of the diazodisulfone compound (2) shown by the following formula (39) as a white solid. The IR spectrum of this diazodisulfone compound (2) is shown in FIG. 3.

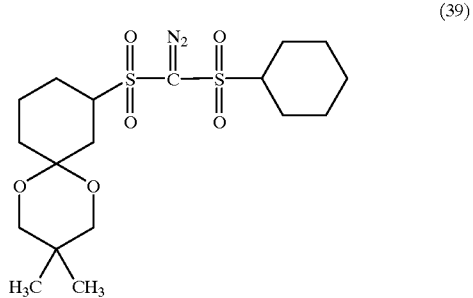

(39)

Examples 1–17 and Comparative Examples 1–2

A homogeneous solution of components shown in Table 1 (in Table 1, "part" shows "parts by weight") was filtered using a Teflon membrane filter having a pore size of 0.2 μm to prepare a composition solution.

Each composition solution was applied to a silicon wafer by rotational coating and PB was performed at a temperature and for a period of time as shown in Table 2 to form a resist film having a thickness of 1.0 μm. This resist film was exposed to a KrF excimer laser (wavelength: 248 nm) while changing the dose through mask patterns using a KrF excimer laser irradiation apparatus (manufactured by Nikon, trade name: NSR-2005 EX8A). In addition, in some Examples, the resist film was exposed to electron beams while changing the light exposure through mask patterns using a simplified electron beam irradiation apparatus (50 KeV) instead of a KrF excimer laser. After exposure, PEB was performed at a temperature and for a period of time as shown in Table 2.

The resist film was developed at 23° C. for 60 seconds using a 2.38 wt % tetramethylammonium hydroxide aqueous solution as a developer and the resist film was washed with water for 30 seconds and dried to form a resist pattern.

The results of the evaluation of each resist prepared in the Examples and Comparative Examples are shown in Table 3. The method of evaluating the resist was described below.

Sensitivity

The resist film applied to a silicon wafer was exposed to radiation while changing the dose, immediately followed by the PEB treatment. After developing in an alkaline developer, the resist film was washed with water and dried to form the resist pattern. In this instance, the dose which can form a one-to-one line and space pattern (1L1S) at a 0.25 μm line width was determined as an optimum dose, which was taken as the sensitivity in the evaluation.

Resolution

The minimum dimension (μm) of the resist pattern resolved at an optimum dose was taken as the resolution of the resist film.

Pattern

The dimensions of the lower side (La) and the upper side (Lb) of the cross-section of the 1L1S of a line width of 0.25 μm formed on a silicon wafer were measured by using a scanning electron microscope. When $0.85 \leq Lb/La \leq 1$ was satisfied, the pattern was evaluated as "good", and when $0.85 \leq Lb/La \leq 1$ was not satisfied, the pattern was evaluated as "bad".

Skirt-like Foot

Figure 4:
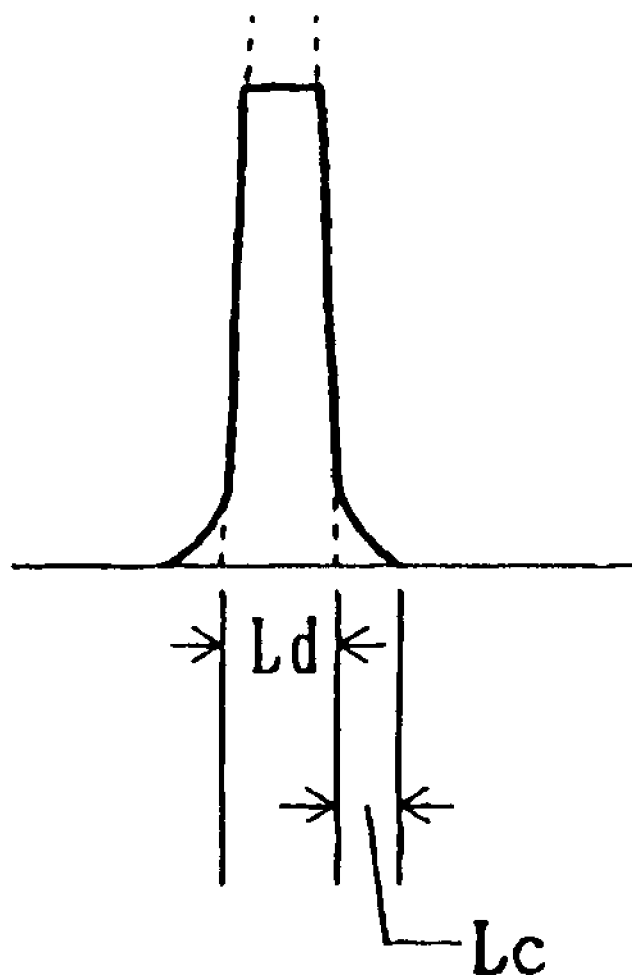
FIG. 4 is an outline drawing describing an evaluation of a skirt-like foot.

The compositions of which the pattern form was evaluated as "good" when forming a 1L1S pattern with a 0.25 μm line width on a silicon wafer at an optimum dose was used for the test. A resist pattern was formed using these compositions on a silicon nitride substrate in the same manner as the pattern was formed on a silicon wafer. The cross-section of the 1L1S pattern with a 0.25 μm line width was observed by using a scanning electron microscope and Lc and Ld shown in FIG. 4 were measured. When Lc/Ld<0.05 was satisfied, the skirt-like foot was evaluated as "good", and when Lc/Ld<0.05 was not satisfied, the skirt-like foot was evaluated as "bad".

Each component used in the Examples and Comparative Examples is as follows.

Diazodisulfone Compound (1) or Diazodisulfone Compound (2)

A-1: The compound shown by the above formula (35)
A-2: The compound shown by the above formula (37)
A-3: The compound shown by the above formula (39)

Other Acid Generator

α-1: 1,1-bis(phenylsulfonyl)cyclohexane
α-2: triphenylsulfoniumnonafluoro-n-butanesulfonate
α-3: bis(4-t-butylphenyl)iodonium 10-camphorsulfonate
α-4: bis(cyclohexylsulfonyl)diazomethane Resin (B)

B-1: a resin in which 34 mol % of hydrogen atoms of phenolic hydroxyl groups in poly(4-hydroxystyrene) is replaced by 1-ethoxyethyl groups (Mw=9,000)
B-2: a resin in which 15 mol % of hydrogen atoms of phenolic hydroxyl groups in poly(4-hydroxystyrene) is replaced by 1-ethoxyethyl groups and 18 mol % of a hydrogen atom is replaced by 1-ethoxypropyl groups (Mw=10,000)
B-3: a resin in which 25 mol % of hydrogen atoms of phenolic hydroxyl groups in poly(4-hydroxystyrene) is replaced by 1-ethoxyethyl groups and 8 mol % of hydrogen atoms is replaced by t-butoxycarbonyl groups (Mw=10,000)
B-4: a resin in which 23 mol % of hydrogen atoms of phenolic hydroxyl groups in poly(4-hydroxystyrene) is replaced by 1-ethoxyethyl groups and 10 mol % of hydrogen atoms is replaced by t-butyl groups (Mw=12,000)
B-5: a resin in which 25 mol % of hydrogen atoms of phenolic hydroxyl groups in a 4-hydroxystyrene/styrene copolymer (copolymerization molar ratio=90/10) is replaced by 1-cyclohexyloxyethyl groups (Mw=18,000)
B-6: a resin in which 25 mol % of hydrogen atoms of phenolic hydroxyl groups in 4-hydroxystyrene/t-butyl acrylate copolymer (copolymerization molar ratio=90/10) is replaced by 1-ethoxyethyl groups (Mw=18,000)
B-7: a partially crosslinked resin in which 24 mol % of hydrogen atoms of phenolic hydroxyl groups in poly(4-hydroxystyrene) (Mw=5,000) is replaced by 1-ethoxyethyl groups, and made into a hexamer (in average) with crosslinking groups having a diethylene glycol skeleton (Mw=30,000)

This resin is prepared by reacting poly (4-hydroxystyrene) (Mw=5,000) with ethyl vinyl ether and diethylene glycol divinyl ether in the presence of p-toluenesulfonic acid pyridinium salt.

Resin (C)

C-1: a resin in which 26 mol % of hydrogen atoms of phenolic hydroxyl groups in poly(4-hydroxystyrene) is replaced by t-butoxycarbonyl groups (Mw=9,000)
C-2: a resin in which 26 mol % of hydrogen atoms of phenolic hydroxyl groups in poly(4-hydroxystyrene) is replaced by t-butoxycarbonylmethyl groups (Mw=25,000)
C-3: a resin in which 32 mol % of hydrogen atoms of phenolic hydroxyl groups in poly(4-hydroxystyrene) is replaced by t-butyl groups (Mw=15,000)
C-4: a 4-hydroxystyrene/styrene/t-butyl acrylate copolymer (copolymerization molar ratio=60:20:20, Mw=12,500)

Dissolution Controller

β-1: a compound shown by the following formula (41)

Acid Diffusion Controller

γ-1: dimethyln-dodecylamine
γ-2: tri-n-hexylamine
γ-3: benzimidazole
γ-4: 2-benzylpyridine Solvent δ-1: ethyl lactate
δ-2: propylene glycol monomethyl ether acetate
δ-3: 2-heptanone

TABLE 1

| | Acid generator (part) | | | | | | |
|---|---|---|---|---|---|---|---|
| | Component (A) | Component (α) | Resin (B) (part) | Resin (C) (part) | Dissolution controller | Acid diffusion controller | Solvent |
| Example 1 | A-1 (8) | — | B-1 (60) | C-3 (40) | — | γ-1 (0.30) | δ-2 (30) δ-2 (70) |
| Example 2 | A-1 (5) | — | B-1 (70) | C-4 (30) | — | γ-2 (0.35) | δ-2 (100) |
| Example 3 | A-1 (7) | α-1 (3.0) | B-1 (50) | C-1 (50) | — | γ-1 (0.30) | δ-2 (100) |
| Example 4 | A-2 (3) | — | B-2 (80) | C-2 (20) | — | γ-2 (0.20) | δ-2 (100) |
| Example 5 | A-3 (7) | — | B-3 (100) | — | — | γ-2 (0.10) γ-3 (0.10) | δ-2 (100) |
| Example 6 | A-2 (6) | — | B-4 (100) | — | — | γ-2 (0.20) | δ-2 (100) |
| Example 7 | A-2 (4) | — | B-6 (75) | C-1 (25) | — | γ-1 (0.35) | δ-2 (100) |
| Example 8 | A-1 (5) | — | B-7 (40) | C-1 (10) C-3 (50) | — | γ-1 (0.20) | δ-2 (100) |
| Example 9 | A-3 (4) | α-2 (1.0) | B-2 (40) | C-1 (10) C-3 (50) | — | γ-1 (0.30) | δ-2 (100) |
| Example 10 | A-2 (4) | — | B-1 (50) | C-1 (50) | — | γ-1 (0.20) | δ-1 (30) δ-2 (70) |
| Example 11 | A-1 (5) | α-2 (0.5) | B-1 (60) | C-3 (40) | — | γ-1 (0.20) | δ-1 (30) δ-2 (70) |
| Example 12 | A-3 (8) | — | B-4 (20) | C-4 (80) | — | γ-1 (0.20) | δ-1 (30) δ-2 (70) |
| Example 13 | A-1 (8) A-2 (2) | — | B-5 (50) | C-4 (50) | — | γ-1 (0.20) | δ-1 (30) δ-2 (70) |
| Example 14 | A-1 (2) | α-1 (5.0) α-3 (0.3) | B-6 (10) | C-4 (90) | — | γ-2 (0.15) γ-4 (0.15) | δ-1 (30) δ-2 (70) |
| Example 15 | A-2 (5) | α-2 (0.5) | B-1 (60) | C-1 (40) | — | γ-1 (0.20) | δ-2 (50) δ-3 (50) |
| Example 16 | A-1 (5) | α-2 (0.5) | B-7 (20) | C-1 (70) | β-1 (10) | γ-1 (0.20) | δ-1 (100) |
| Example 17 | A-2 (4) | α-2 (0.3) | B-3 (50) B-4 (50) | — | — | γ-1 (0.15) | δ-1 (20) δ-2 (80) |
| Comparative Example 1 | — | α-2 (1.0) | — | C-2 (100) | — | γ-1 (0.30) | δ-2 (100) |
| Comparative Example 2 | — | α-4 (5.0) | B-1 (80) | C-1 (20) | — | γ-1 (0.30) | δ-2 (100) |

TABLE 2

| | PB | | Exposure light | PEB | |
|---|---|---|---|---|---|
| | Temperature (° C.) | Time (second) | source | Temperature (° C.) | Time (second) |
| Example 1 | 90 | 90 | KrF eximer laser | 100 | 90 |
| Example 2 | 90 | 60 | KrF eximer laser | 90 | 60 |
| Example 3 | 90 | 60 | KrF eximer laser | 90 | 90 |
| Example 4 | 100 | 60 | KrF eximer laser | 110 | 60 |
| Example 5 | 110 | 90 | KrF eximer laser | 110 | 90 |
| Example 6 | 90 | 60 | KrF eximer laser | 120 | 60 |
| Example 7 | 95 | 90 | KrF eximer laser | 110 | 90 |

TABLE 2-continued

|  | PB | | Exposure light | PEB | |
| --- | --- | --- | --- | --- | --- |
|  | Temperature (° C.) | Time (second) | source | Temperature (° C.) | Time (second) |
| Example 8 | 90 | 60 | KrF eximer laser | 100 | 60 |
| Example 9 | 90 | 60 | KrF eximer laser | 90 | 60 |
| Example 10 | 90 | 90 | KrF eximer laser | 100 | 90 |
| Example 11 | 130 | 60 | KrF eximer laser | 130 | 60 |
| Example 12 | 100 | 60 | KrF eximer laser | 115 | 60 |
| Example 13 | 80 | 60 | KrF eximer laser | 100 | 90 |
| Example 14 | 90 | 60 | KrF eximer laser | 90 | 60 |
| Example 15 | 90 | 90 | KrF eximer laser | 90 | 90 |
| Example 16 | 100 | 60 | Electron beams | 110 | 60 |
| Example 17 | 110 | 60 | Electron beams | 110 | 60 |
| Comparative Example 1 | 90 | 60 | KrF eximer laser | 100 | 60 |
| Comparative Example 2 | 90 | 60 | KrF eximer laser | 100 | 60 |

TABLE 3

|  | Sensitivity | Resolution (μm) | Pattern | Skirt-like foot |
| --- | --- | --- | --- | --- |
| Example 1 | 21 mJ/cm$^2$ | 0.21 | Good | Good |
| Example 2 | 24 mJ/cm$^2$ | 0.21 | Good | Good |
| Example 3 | 24 mJ/cm$^2$ | 0.21 | Good | Good |
| Example 4 | 25 mJ/cm$^2$ | 0.22 | Good | Good |
| Example 5 | 29 mJ/cm$^2$ | 0.22 | Good | Good |
| Example 6 | 23 mJ/cm$^2$ | 0.21 | Good | Good |
| Example 7 | 21 mJ/cm$^2$ | 0.21 | Good | Good |
| Example 8 | 18 mJ/cm$^2$ | 0.21 | Good | Good |
| Example 9 | 24 mJ/cm$^2$ | 0.21 | Good | Good |
| Example 10 | 23 mJ/cm$^2$ | 0.22 | Good | Good |
| Example 11 | 21 mJ/cm$^2$ | 0.22 | Good | Good |
| Example 12 | 21 mJ/cm$^2$ | 0.22 | Good | Good |
| Example 13 | 28 mJ/cm$^2$ | 0.21 | Good | Good |
| Example 14 | 22 mJ/cm$^2$ | 0.22 | Good | Good |
| Example 15 | 22 mJ/cm$^2$ | 0.22 | Good | Good |
| Example 16 | 5 μC/cm$^2$ | 0.21 | Good | Good |
| Example 17 | 5 μC/cm$^2$ | 0.22 | Good | Good |
| Comparative Example 1 | 34 mJ/cm$^2$ | 0.25 | Bad | — |
| Comparative Example 2 | 29 mJ/cm$^2$ | 0.24 | Good | Bad |

The diazodisulfone compound (1) of the first invention and the diazodisulfone compound (2) of the second invention are capable of efficiently generating an acid with high sensitivity (low exposure energy) for various radioactive rays, in particular, far ultraviolet rays represented by a KrF excimer laser, ArF excimer laser, and the like, exhibits excellent storage stability, and can provide a resist with superior resolution performance and patterns when used as a photoacid generator for chemically amplified resists useful for microfabrication.

The radiation-sensitive resin composition of the third invention comprising the diazodisulfone compound (1), diazodisulfone compound (2), and resin (B) exhibits high sensitivity (low exposure energy), can provide a resist with superior resolution performance and patterns, and, in particular, is useful as chemically amplified resists for the manufacture of semiconductor devices that are expected to become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A diazodisulfone compound shown by the following formula (1),

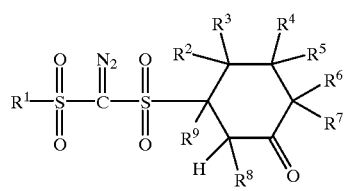

(1)

wherein $R^1$ is a monovalent organic group and $R^2$–$R^9$ independently represent a hydrogen atom, an alkyl group having 1–4 carbon atoms, an alkoxyl group having 1–4 carbon atoms, or a hydroxyalkyl group having 1–4 carbon atoms.

2. A diazodisulfone compound shown by the following formula (2),

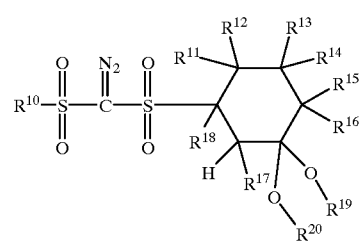

(2)

wherein $R^{10}$ is a monovalent organic group, $R^{11}$–$R^{18}$ independently represent a hydrogen atom, an alkyl group having 1–4 carbon atoms, an alkoxyl group having 1–4 carbon atoms, or a hydroxyalkyl group having 1–4 carbon atoms, and $R^{19}$ and $R^{20}$ independently represent an alkyl group having 1–4 carbon atoms or $R^{19}$ and $R^{20}$ in combination represent a divalent organic group having 2–8 carbon atoms which forms a heterocyclic structure with an oxygen.

3. A radiation-sensitive resin composition comprising (A) the diazodisulfone compound of claim 1 and (B) a resin having a recurring unit shown by the following formula (3) and a recurring unit shown by the following formula (4),

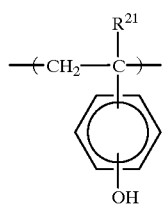
(3)

wherein $R^{21}$ represents a hydrogen atom or a methyl group,

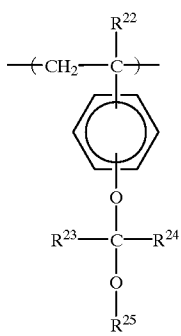
(4)

wherein $R^{22}$ and $R^{23}$ independently represent a hydrogen atom or a methyl group, $R^{24}$ represents an alkyl group having 1–4 carbon atoms, and $R^{25}$ represents an alkyl group having 1–6 carbon atoms.

4. A radiation-sensitive resin composition comprising (A) the diazodisulfone compound of claim 2 and (B) a resin having a recurring unit shown by the following formula (3) and a recurring unit shown by the following formula (4),

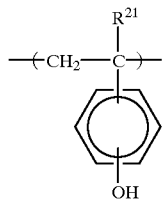
(3)

wherein $R^{21}$ is a hydrogen atoms or methyl group,

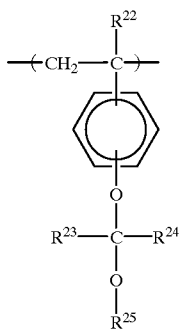
(4)

wherein $R^{22}$ and $R^{23}$ independently represent a hydrogen atom or methyl group, $R^{24}$ shows an alkyl group having 1–4 carbon atoms, and $R^{25}$ indicates an alkyl group having 1–6 carbon atoms.

5. The diazodisulfone compound of claim 1, wherein $R^1$ is selected from the group consisting of a t-butyl group, cyclopentyl group, cyclohexyl group, phenyl group, benzyl group, phenethyl group, and a group represented by the following formula (5):

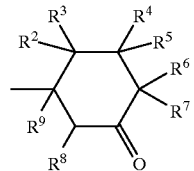
(5)

wherein $R^2$–$R^9$ independently represent a hydrogen atom, an alkyl group having 1–4 carbon atoms, an alkoxyl group having 1–4 carbon atoms, or a hydroxyalkyl group having 1–4 carbon atoms.

6. The diazodisulfone compound of claim 2, wherein $R^{10}$ is selected from the group consisting of a t-butyl group, cyclopentyl group, cyclohexyl group, phenyl group, benzyl group, phenethyl group, a group represented by the following formula (5),

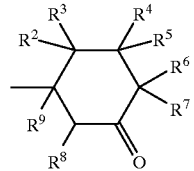
(5)

wherein $R^2$–$R^9$ independently represent a hydrogen atom, an alkyl group having 1–4 carbon atoms, an alkoxyl group having 1–4 carbon atoms, or a hydroxyalkyl group having 1–4 carbon atoms, and a group represented by the following formula (6):

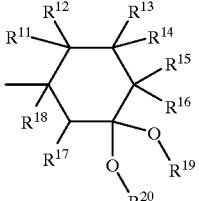
(6)

wherein $R^{11}$–$R^{18}$ independently represent a hydrogen atom, an alkyl group having 1–4 carbon atoms, an alkoxyl group having 1–4 carbon atoms, or a hydroxyalkyl group having 1–4 carbon atoms, and $R^{19}$ and $R^{20}$ independently represent an alkyl group having 1–4 carbon atoms or $R^{19}$ and $R^{20}$ in combination represent a divalent organic group having 2–8 carbon atoms which forms a heterocyclic structure with an oxygen.

7. The radiation-sensitive resin composition of claim 3, further comprising an acid generator other than the diazodisulfone compound of claim 1.

8. The radiation-sensitive resin composition of claim 4, further comprising an acid generator other than the diazodisulfone compound of claim 2.

9. The radiation-sensitive resin composition of claim 3, further comprising a resin containing an acid-decomposable group other than the resin of the component (B).

10. The radiation-sensitive resin composition of claim 4, further comprising a resin containing an acid-decomposable group other than the resin of the component (B).

11. The radiation-sensitive resin composition of claim 3, further comprising an acid diffusion controlling agent.

12. The radiation-sensitive resin composition of claim 4, further comprising an acid diffusion controlling agent.

13. The radiation-sensitive resin composition of claim 11, wherein the acid diffusion controlling agent is a nitrogen-containing compound.

14. The radiation-sensitive resin composition of claim 12, wherein the acid diffusion controlling agent is a nitrogen-containing compound.

* * * * *